(12) United States Patent
Yoon et al.

(10) Patent No.: US 12,150,347 B2
(45) Date of Patent: Nov. 19, 2024

(54) DISPLAY DEVICE HAVING AN OPENING IN AN INSULATING LAYER EXPOSING AN CONDUCTIVE LAYER AND METHOD OF MANUFACTURING THE SAME

(71) Applicant: Samsung Display Co., LTD., Yongin-si (KR)

(72) Inventors: Ju Won Yoon, Suwon-si (KR); Tae Hoon Yang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 409 days.

(21) Appl. No.: 17/406,236

(22) Filed: Aug. 19, 2021

(65) Prior Publication Data

US 2022/0208899 A1 Jun. 30, 2022

(30) Foreign Application Priority Data

Dec. 24, 2020 (KR) .................. 10-2020-0183188

(51) Int. Cl.
| | |
|---|---|
| *H01L 27/32* | (2006.01) |
| *H01L 51/56* | (2006.01) |
| *H10K 59/121* | (2023.01) |
| *H10K 59/122* | (2023.01) |
| *H10K 71/00* | (2023.01) |

(52) U.S. Cl.
CPC ......... *H10K 59/122* (2023.02); *H10K 59/121* (2023.02); *H10K 71/00* (2023.02)

(58) Field of Classification Search
CPC .................................................. H10K 59/124
See application file for complete search history.

(56) References Cited

U.S. PATENT DOCUMENTS

| | | | |
|---|---|---|---|
| 9,577,019 B2 | 2/2017 | An et al. | |
| 2016/0111484 A1* | 4/2016 | An | G09G 3/3266 |
| | | | 438/155 |
| 2017/0155000 A1* | 6/2017 | Moon | H10K 59/1201 |
| 2017/0229554 A1* | 8/2017 | Choi | H01L 21/02274 |
| 2018/0145125 A1* | 5/2018 | Lee | H10K 59/131 |
| 2020/0211437 A1* | 7/2020 | Ahn | H10K 59/131 |
| 2020/0395425 A1* | 12/2020 | Han | H10K 59/126 |

FOREIGN PATENT DOCUMENTS

| | | | | |
|---|---|---|---|---|
| CN | 112086485 A | * 12/2020 | ........... | H01L 27/124 |
| KR | 1020160047132 | 5/2016 | | |
| KR | 1020160054867 | 5/2016 | | |
| KR | 1020200081945 | 7/2020 | | |

* cited by examiner

*Primary Examiner* — Peter Bradford
(74) *Attorney, Agent, or Firm* — CANTOR COLBURN LLP

(57) ABSTRACT

A display device includes a plurality of first pixels, a substrate, a first semiconductor layer which is disposed on the substrate and includes an active layer of a first transistor, a first insulating layer which is disposed on the first semiconductor layer, a first conductive layer which is disposed on the first insulating layer and includes a gate electrode of the first transistor, a second insulating layer which is disposed on the first conductive layer, and a second conductive layer which is disposed on the second insulating layer and includes a first electrode and a second electrode of the first transistor, where a first opening exposing the first conductive layer in an area in which the first conductive layer and the second conductive layer of each of the plurality of first pixels do not overlap is defined in the second insulating layer.

22 Claims, 16 Drawing Sheets

DISPLAY DEVICE HAVING AN OPENING IN AN INSULATING LAYER EXPOSING AN CONDUCTIVE LAYER AND METHOD OF MANUFACTURING THE SAME

This application claims priority to Korean Patent Application No. 10-2020-0183188 filed on Dec. 24, 2020, and all the benefits accruing therefrom under 35 U.S.C. § 119, the content of which in its entirety is herein incorporated by reference.

BACKGROUND

1. Field

Embodiments of the invention relate to a display device and a method of manufacturing the same.

2. Description of the Related Art

As an information society develops, a demand for display devices for displaying images is increasing in various forms. Display devices are being applied to various electronic devices such as smartphones, digital cameras, notebook computers, navigation devices, and smart televisions.

The display devices include light-receiving display devices such as liquid crystal display devices, field emission display devices and light emitting display devices and light emitting display devices such as organic light emitting display devices including organic light emitting elements, inorganic light emitting display devices including inorganic light emitting elements such as inorganic semiconductors and micro or nano light emitting display devices including micro or nano light emitting elements.

Of these display devices, the organic light emitting display devices include a light emitting element that enables each pixel of a display panel to emit light by itself. Thus, the light emitting display device can display an image without a backlight wilt that provides light to the display panel.

SUMMARY

Features of the invention provide a display device having improved reliability by suppressing or preventing transmission of external impact and a method of manufacturing the display device.

However, features of the invention are not restricted to the one set forth herein. The above and other features of the invention will become more apparent to one of ordinary skill in the art to which the invention pertains by referencing the detailed description of the invention given below.

An embodiment of a display device includes a plurality of first pixels, a substrate, a first semiconductor layer which is disposed on the substrate and includes an active layer of a first transistor, a first insulating layer which is disposed on the first semiconductor layer, a first conductive layer which is disposed on the first insulating layer and includes a gate electrode of the first transistor, a second insulating layer which is disposed on the first conductive layer, and a second conductive layer which is disposed on the second insulating layer and includes a first electrode and a second electrode of the first transistor, where a first opening exposing the first conductive layer in an area in which the first conductive layer and the second conductive layer of each of the plurality of first pixels do not overlap is defined in the second insulating layer.

An embodiment of a display device includes a substrate, a semiconductor layer which is disposed on the substrate, a first insulating layer which is disposed on the semiconductor layer, first conductive patterns which are disposed on the first insulating layer, a second insulating layer which is disposed on the first conductive patterns, and a second conductive pattern which is disposed on the second insulating layer, where the second insulating layer is disposed in an area overlapping at least any one of the semiconductor layer and the second conductive pattern and is not disposed in an area in which the first conductive patterns and the second conductive pattern do not overlap.

An embodiment of a method of manufacturing a display device, the method includes preparing a substrate, disposing a semiconductor layer on the substrate, forming a first insulating layer on the semiconductor layer, forming a first conductive layer on the first insulating layer, forming a second insulating layer on the first conductive layer, forming a second conductive layer on the second insulating layer, forming a photoresist pattern in an area which overlaps the semiconductor layer and does not overlap the first conductive layer and the second conductive layer, and exposing the first conductive layer by etching the second insulating layer using the photoresist pattern as an etch mask.

In a display device and a method of manufacturing the same in an embodiment, the transmission of external impact is suppressed or prevented. Therefore, the reliability of the display device may be improved.

However, the effects of the invention are not restricted to the one set forth herein. The above and other effects of the invention will become more apparent to one of daily skill in the art to which the invention pertains by referencing the claims.

BRIEF DESCRIPTION OF THE DRAWINGS

These and/or other features will become apparent and more readily appreciated from the following description of the embodiments, taken in conjunction with the accompanying drawings in which:

FIG. 2 illustrates a side shape of the display device bent in a thickness direction;

DETAILED DESCRIPTION

Figure 1:
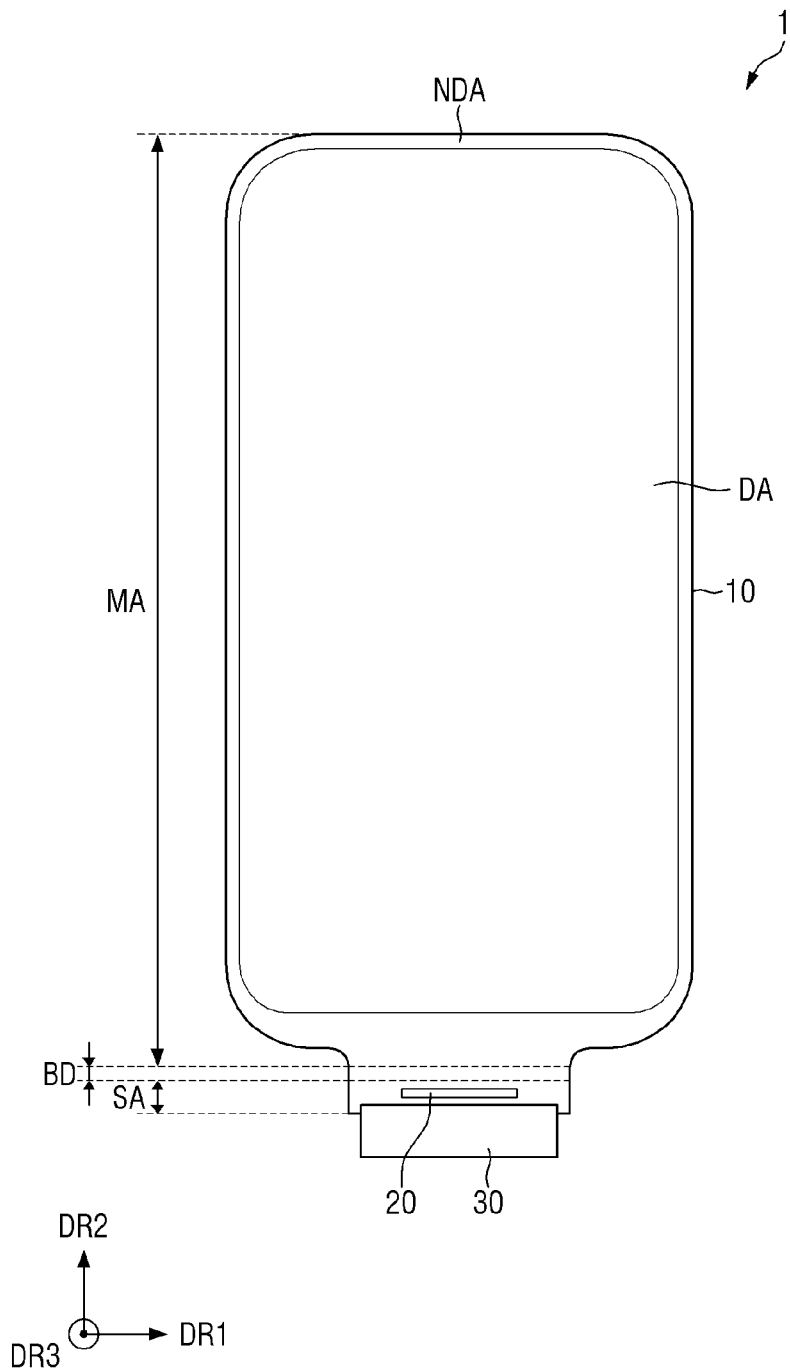
FIG. 1 is a plan view of an embodiment of a display device.

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached drawing figures, the thickness of layers and regions is exaggerated for clarity.

Although the terms "first", "second", etc., may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc., may also be used herein to differentiate different categories or sets of elements. For conciseness, the terms "first", "second", etc., may represent "first-category (or first-set)", "second-category (or second-set)", etc., respectively.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items, it will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs, it will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, embodiments will be described with reference to the attached drawings.

Figure 2:
FIG. 2 is a side view of the display device of FIG. 1.
Figure 2:
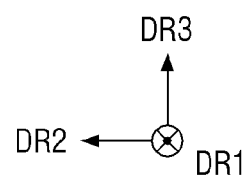

FIG. 1 is a plan view of an embodiment of a display device 1. FIG. 2 is a side view of the display device 1 of FIG. 1. FIG. 2 illustrates a side shape of the display device 1 bent in a thickness direction.

The display device 1 is a device for displaying moving images or still images. The display device 1 may be used as a display screen in portable electronic devices such as mobile phones, smartphones, tablet personal computers ("PCs"), smart watches, watch phones, mobile communication terminals, electronic notebooks, electronic books, portable multimedia players ("PMPs"), navigation devices and ultra-mobile PCs ("UMPCs"), as well as in various products such as televisions, notebook computers, monitors, billboards and the Internet of things ("IoT").

The display device 1 in the embodiment may be substantially quadrangular (e.g., rectangular) in a plan view. The display device 1 may be shaped like a rectangle with right-angled corners in a plan view. However, the invention is not limited thereto, and the display device 1 may also be shaped like a rectangle with rounded corners in a plan view.

In the drawings, a first direction DR1 indicates a horizontal direction of the display device 1 in a plan view, and a second direction DR2 indicates a vertical direction of the display device 1 in a plan view. In addition, a third direction DR3 indicates the thickness direction of the display device 1 and perpendicular to a main plane extension direction of the display device 1 defined by the first direction DR1 and the second direction DR2. The first direction DR1 and the second direction DR2 perpendicularly intersect each other, and the third direction DR3 perpendicularly intersects both the first direction DR1 and the second direction DR2 in a direction intersecting a plane defined by the first direction DR1 and the second direction DR2. However, directions mentioned in embodiments should be understood as relative directions, and the embodiments are not limited to the mentioned directions.

Unless otherwise defined, the terms "upper," "upper surface" and "upper side" used herein based on the third direction DR3 refer to a display surface side of the display device 1, and the terms "lower," "lower surface" and "lower side" refer to an opposite side of the display device 1 to the display surface side.

Referring to FIGS. 1 and 2, the display device 1 may include a display panel 10. The display panel 10 may be a flexible substrate including a flexible polymer material such as polyimide. Accordingly, the display panel 10 may be curved, bent, folded, or rolled.

The display panel 10 may be an organic light emitting display panel. In the following embodiments, a case where an organic light emitting display panel is applied as the display panel 10 will be described as an example. However, the invention is not limited to this case, and other types of display panels such as a liquid crystal display panel, a quantum-dot organic light emitting display panel, a quantum-dot liquid crystal display ("LCD") panel, a quantum-nano light emitting display panel, and a micro light emitting diode display panel are also applicable.

The display panel 10 may include a display area DA where a screen is displayed and a non-display area NDA where no screen is displayed. The display panel 10 may be divided into the display area DA and the non-display area NDA in a plan view. The non-display area NDA may surround the display area DA. The non-display area NDA may form a bezel.

The display area DA may be shaped like a rectangle with right-angled corners or a rectangle with rounded corners in a plan view. However, the planar shape of the display area DA is not limited to the rectangle, but may also be a circle, an oval, or various other shapes.

The display area DA may include a plurality of pixels. The pixels may be arranged in a matrix shape. However, the invention is not limited thereto, and the pixels may be arranged in various other shapes. Each of the pixels may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be sealed by an encapsulation layer. The detailed configuration of each pixel will be described later.

The non-display area NDA may surround all sides of the display area A and form edges of the display area DA. However, the invention is not limited thereto.

The display panel 10 may include a main area MA and a bending area BD connected to a side of the main area MA in the second direction DR2. The display panel 10 may further include a sub area SA which is connected to a side of the bending area BD in the second direction DR2 and is bent in the thickness direction to overlap the main area MA in the thickness direction.

The display area DA may be disposed in the main area MA. The non-display area NDA may be disposed in an edge part around the display area DA of the main area MA.

The main area MA may have a shape similar to the planar shape of the display device 1. The main area MA may be a flat area disposed in one plane. However, the invention is not limited thereto, and at least one of edges of the main area MA excluding an edge (side) connected to the bending area BD may also be curved or may be bent perpendicularly.

When at least one of the edges of the main area MA excluding the edge (side) connected to the bending area BD is curved or bent, the display area DA may also be disposed at the curved or bent edge. However, the invention is not limited thereto, and the non-display area NDA where no screen is displayed or both the display area DA and the non-display area NDA may also be disposed at the curved or bent edge.

The non-display area NDA of the main area MA may extend from an outer boundary of the display area DA to edges of the display panel 10. Signal wirings or driving circuits for transmitting signals to the display area DA may be disposed in the non-display area NDA of the main area MA.

The bending area BD may be connected to a short side of the main area MA. A width (in the first direction DR1) of the bending area BD may be smaller than a width (of the short side) of the main area MA. A connection part of the main area MA and the bending area BD may have an L-cut shape to reduce a width of a bezel.

In the bending area BD, the display panel 10 may be bent with a curvature in a direction opposite to a display surface. As the display panel 10 is bent in the bending area BD, a surface of the display panel 10 may be reversed. That is, a surface of the display panel 10 which faces upward may be changed to face outward laterally through the bending area BD and then to face downward.

The sub area SA extends from the bending area BD. The sub area SA may start after bending is completed and may extend parallel to the main area MA. The sub area SA may be overlapped by the main area MA in the thickness direction of the display panel 10. The sub area SA may be overlapped by the non-display area NDA at an edge of the main area MA and may be further overlapped by the display area DA of the main area MA. A width of the sub area SA may be, but is not necessarily, equal to the width of the bending area BD.

A pad part (not illustrated) may be disposed on the sub area SA of the display panel 10. An external device may be disposed (e.g., mounted or attached) on the pad part (not illustrated). Examples of the external device include a driving chip 20 and a driving board 30 including a flexible printed circuit board or a rigid printed circuit board. In addition, a wiring connection film, a connector, etc., may be disposed (e.g., mounted) on the pad part as external devices. Only one external device or a plurality of external devices may be disposed (e.g., mounted) on the sub area SA. In an embodiment, as illustrated in FIGS. 1 and 2, the driving chip 20 may be disposed on the sub area SA of the display panel 10, and the driving board 30 may be attached to an end of the sub area SA, for example. In this case, the display panel 10 may include both a pad part connected to the driving chip 20 and a pad part connected to the driving board 30. In an embodiment, a driving chip may be disposed (e.g., mounted) on a film, and the film may be attached to the sub area SA of the display panel 10.

The driving chip 20 may be disposed (e.g., mounted) on a surface of the display panel 10 which is the same surface as the display surface. As the surface of the display panel 10 is reversed by the bending of the bending area BD as described above, an upper surface of the driving chip 20 disposed (e.g., mounted) on the surface of the display panel 10 facing downward in the thickness direction may face downward.

The driving chip 20 may be attached onto the display panel 10 through an anisotropic conductive film or may be attached onto the display panel 10 through ultrasonic bonding. The driving chip 20 may include an integrated circuit for driving the display panel 10.

Figure 3:
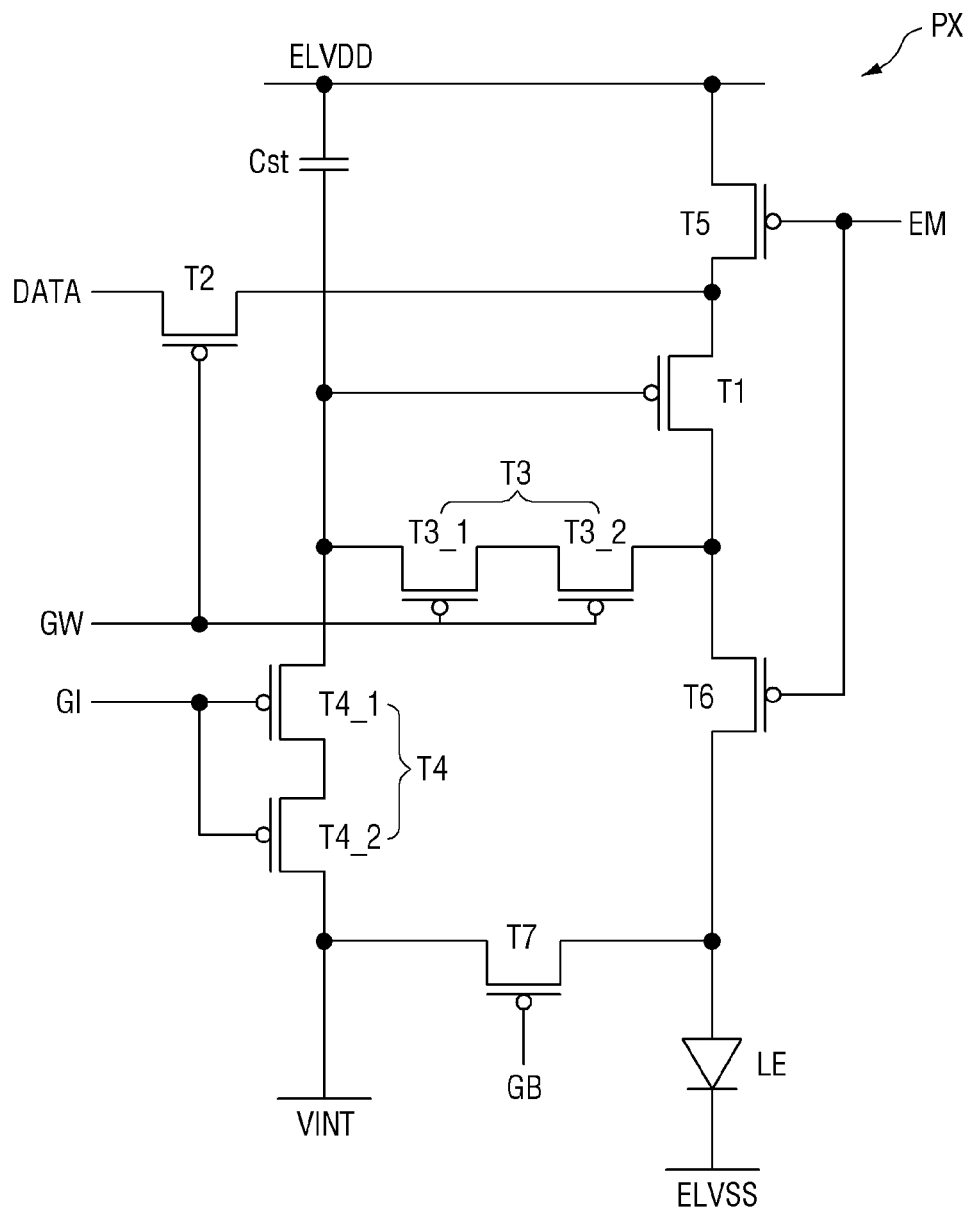
FIG. 3 is a circuit diagram of an embodiment of a pixel.

FIG. 3 is a circuit diagram of an embodiment of a pixel PX.

Referring to FIG. 3, the circuit of the pixel PX includes a plurality of transistors T1 through T7, a capacitor Cst, and a light emitting element LE. A data signal DATA, a first scan signal GW, a second scan signal GI, a third scan signal GB, an emission control signal EM, a first power voltage ELVDD, a second power voltage ELVSS, and an initialization voltage VINT are applied to the circuit of one pixel PX.

Figure 6:
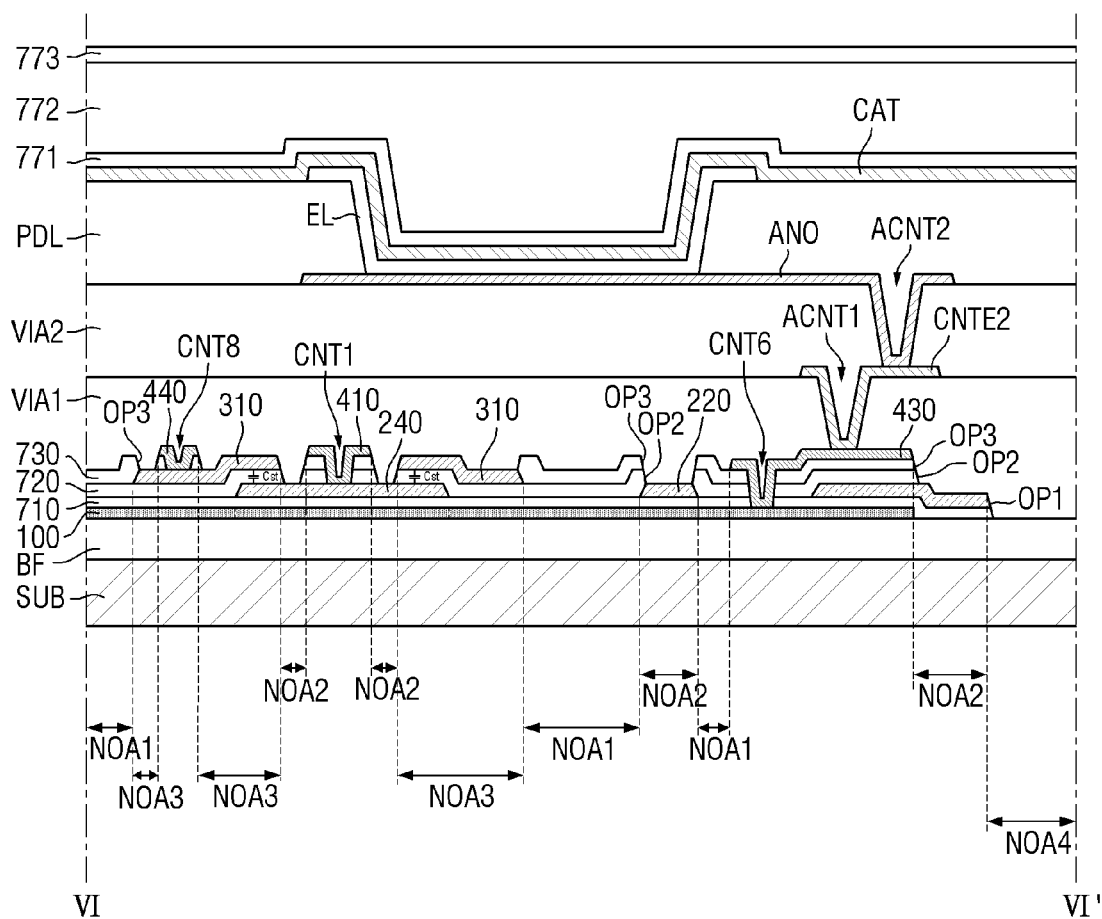
FIG. 6 is a cross-sectional view taken along line VI-VI' of FIG. 4.

The light emitting element LE may be, but is not limited to, an organic light emitting diode including a first electrode (or an anode ANO of FIG. 6), a light emitting layer EL (refer to FIG. 6), and a second electrode (or a cathode CAT of FIG. 6).

The transistors may include first through seventh transistors T1 through T7. Each of the transistors T1 through T7 includes a gate electrode, a first electrode, and a second electrode. Any one of the first electrode and the second electrode of each of the transistors T1 through T7 is a source electrode, and the other is a drain electrode.

The first transistor T1 may serve as a driving transistor, and the second through seventh transistors T2 through T7 may serve as switching transistors. Each of the transistors T1 through T7 includes the gate electrode, the first electrode and the second electrode. Any one of the first electrode and the second electrode of each of the transistors T1 through T7 is a source electrode, and the other is a drain electrode.

Each of the transistors T1 through T7 may be a thin-film transistor. Each of the transistors T1 through T7 may be any one of a p-channel metal oxide semiconductor ("PMOS") transistor and an n-channel metal oxide semiconductor ("NMOS") transistor. In an embodiment, the first transistor T1 as a driving transistor, the second transistor T2 as a data transfer transistor, the third transistor T3 as a compensation transistor, the fourth transistor T4 as a first initialization transistor, the fifth transistor T5 as a first emission control transistor, the sixth transistor T6 as a second emission control transistor, and the seventh transistor T7 as a second initialization transistor are all PMOS transistors.

However, the invention is not limited thereto. In an embodiment, the third transistor T3 as the compensation transistor and the fourth transistor T4 as the first initialization transistor may be NMOS transistors, and the first transistor T1 as the driving transistor, the second transistor T2 as the data transfer transistor, the fifth transistor T5 as the first emission control transistor, the sixth transistor T6 as the second emission control transistor, and the seventh transistor T7 as the second initialization transistor may be PMOS transistors.

In this case, active layers of the third transistor T3 and the fourth transistor T4 may include a different material from active layers of the first transistor T1, the second transistor T2, the fifth transistor T5, the sixth transistor T6 and the seventh transistor T7. Although the invention is not limited to the following case, for example, the active layers of the third transistor T3 and the fourth transistor T4 may include an oxide semiconductor, and the active layers of the first transistor T1, the second transistor T2, the fifth transistor T5, the sixth transistor T6 and the seventh transistor T7 may include polycrystalline silicon.

Each element will now be described in detail.

The gate electrode of the first transistor T1 is connected to a first electrode of the capacitor Cst. The first electrode of the first transistor T1 is connected to a first power voltage (ELVDD) terminal via the fifth transistor T5. The second electrode of the first transistor T1 is connected to the anode of the light emitting element LE via the sixth transistor T6. The first transistor T1 receives the data signal DATA according to a switching operation of the second transistor T2 and supplies a driving current to the light emitting element LE.

The gate electrode of the second transistor T2 is connected to a first scan signal (GW) terminal. The first electrode of the second transistor T2 is connected to a data signal (DATA) terminal. The second electrode of the second transistor T2 is connected to the first electrode of the first transistor T1 and is connected to the first power voltage (ELVDD) terminal via the fifth transistor T5. The second transistor T2 is turned on according to the first scan signal GW and performs a switching operation to transfer the data signal DATA to the first electrode of the first transistor T1.

The third transistor T3 may be formed or provided as a dual transistor including a first sub transistor T3_1 and a second sub transistor T3_2. The first sub transistor T3_1 includes a gate electrode connected to the first scan signal (GW) terminal, a first electrode connected to a second electrode of the second sub transistor T3_2, and a second electrode connected to the first electrode of the capacitor Cst, a first electrode of a third sub transistor T4_1 and the gate electrode of the first transistor T1. The second sub transistor T3_2 includes a gate electrode connected to the first scan signal (GW) terminal, a first electrode connected to the second electrode of the first transistor T1, and the second electrode connected to the first electrode of the first sub transistor T3_1.

The first sub transistor T3_1 and the second sub transistor T3_2 are turned on by the first scan signal GW and connect the gate electrode and the second electrode of the first transistor T1 to diode-connect the first transistor T1. Accordingly, a voltage difference corresponding to a threshold voltage of the first transistor T1 may be generated between the first electrode and the gate electrode of the first transistor T1, and the data signal DATA compensated for the threshold voltage may be supplied to the gate electrode of the first transistor T1 to compensate for a threshold voltage deviation of the first transistor T1.

The fourth transistor T4 may be formed or provided as a dual transistor including the third sub transistor T4_1 and a fourth sub transistor T4_2. The third sub transistor T4_1 may include a gate electrode connected to a second scan signal (GI) terminal, the first electrode connected to the first electrode of the capacitor Cst, the second electrode of the first sub transistor T3_1 and the gate electrode of the first transistor T1, and a second electrode connected to a first electrode of the fourth sub transistor T4_2. The fourth sub transistor T4_2 may include a gate electrode connected to the second scan signal (GI) terminal, the first electrode connected to the second electrode of the third sub transistor T4_1, and a second electrode connected to the initialization voltage (VINT) terminal. The third sub transistor T4_1 and the fourth sub transistor T4_2 are turned on by the second scan signal GI and transfer the initialization voltage VINT to the gate electrode of the first transistor T1, thereby initializing the voltage of the gate electrode of the first transistor T1.

The fifth transistor T5 includes the gate electrode connected to an emission control signal (EM) terminal, the first electrode connected to the first power voltage (ELVDD) terminal, and the second electrode connected to the first electrode of the first transistor T1.

The fifth transistor T5 is turned on by the emission control signal EM to connect the first electrode of the first transistor T1 and the first power voltage (ELVDD) terminal.

The sixth transistor T6 is connected between the second electrode of the first transistor T1 and the first electrode of the light emitting element LE. The sixth transistor T6 includes the gate electrode connected to the emission control signal (EM) terminal, the first electrode connected to the second electrode of the first transistor T1 and the first electrode of the second sub transistor T3_2, and the second electrode connected to the first electrode of the light emitting element LE.

The fifth transistor T5 and the sixth transistor T6 are simultaneously turned on according to the emission control signal EM. Accordingly, a driving current flows through the light emitting element LE.

The gate electrode of the seventh transistor T7 is connected to a third scan signal (GB) terminal. The first electrode of the seventh transistor T7 is connected to the anode of the light emitting element LE. The second electrode of the seventh transistor T7 is connected to an initialization voltage (VINT) terminal. The seventh transistor T7 is turned on according to the third scan signal GB to initialize the anode of the organic light emitting element LE.

In the illustrated embodiment, the gate electrode of the seventh transistor T7 receives the third scan signal GB. However, in another embodiment, the circuit of the pixel PX may be configured such that the gate electrode of the seventh transistor T7 receives the emission control signal EM or the second scan signal GI.

The capacitor Cst is formed or provided between the gate electrode of the first transistor T1 and the first power voltage (ELVDD) terminal and includes the first electrode and a second electrode. The first electrode of the capacitor Cst may be connected to the gate electrode of the first transistor T1, the second electrode of the third transistor T3 and the first electrode of the fourth transistor T4, and the second electrode of the capacitor Cst may be connected to the first power voltage (ELVDD) terminal. The capacitor Cst may maintain a data voltage applied to the gate electrode of the first transistor T1 constant.

The cathode of the light emitting element LE is connected to a second power voltage (ELVSS) terminal. The light emitting element LE emits light by receiving a driving current from the first transistor T1, thereby displaying an image.

The planar layout and cross-sectional structure of the above-described pixel PX will now be described in detail.

Figure 4:
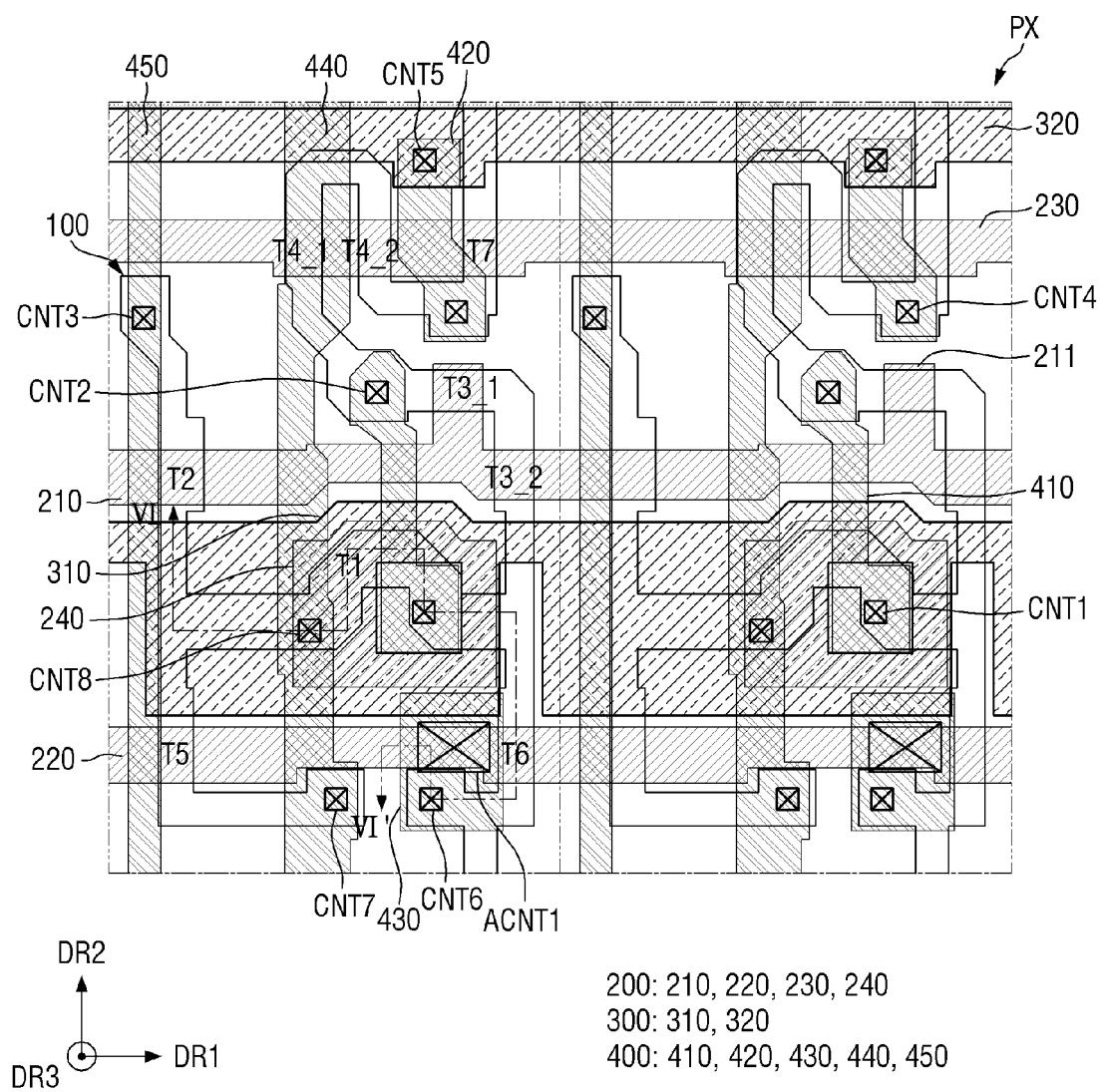
FIG. 4 is a plan view of an embodiment of pixels of the display device.
Figure 5:
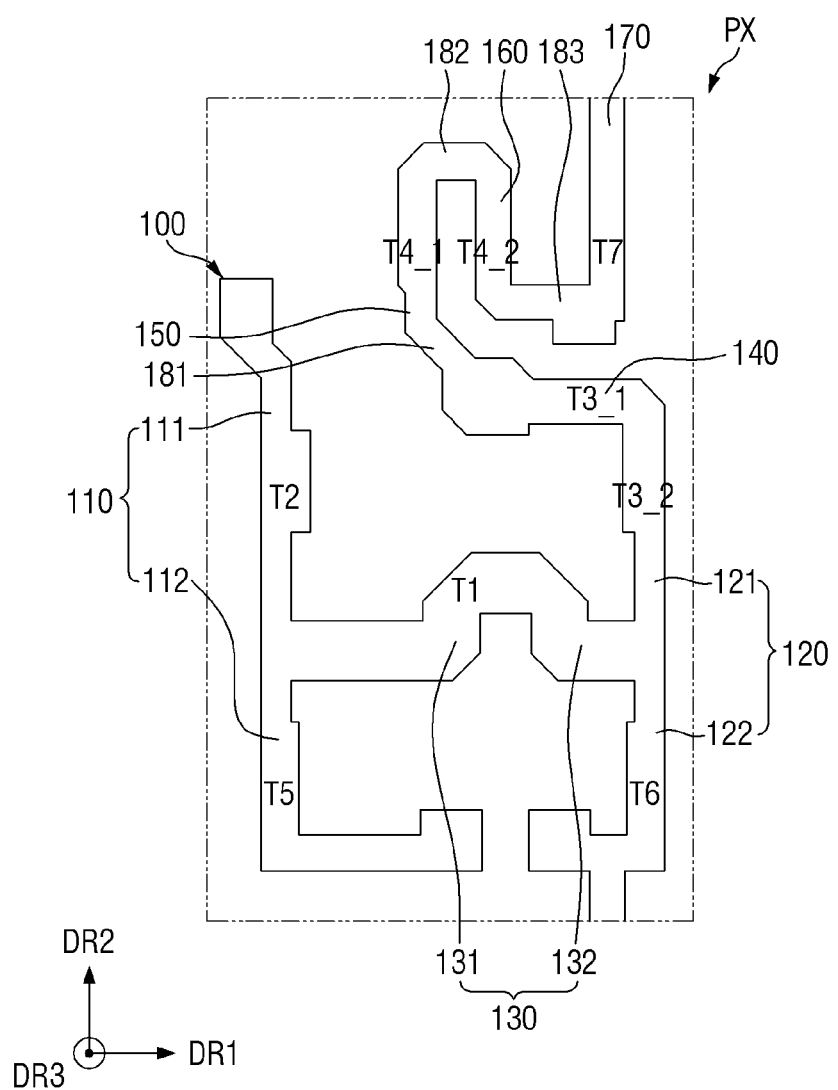
FIG. 5 is a plan view of an embodiment of a semiconductor layer of a pixel.

FIG. 4 is a plan view of an embodiment of pixels PX of the display device 1. FIG. 5 is a plan view of an embodiment of a semiconductor layer of a pixel PX. FIG. 6 is a cross-sectional view taken along line VI-VI' of FIG. 4.

Referring to FIGS. 4 through 6, as described above, each pixel PX includes the transistors T1 through T7, the capacitor Cst (refer to FIG. 3), and the light emitting element LE (refer to FIG. 3).

The capacitor Cst includes conductive layers forming electrodes and an insulating layer disposed between the conductive layers. The light emitting element LE (refer to FIG. 3) includes conductive layers forming the anode ANO and the cathode CAT and the light emitting layer EL disposed between the conductive layers. The electrical connection of each element may be achieved by a wiring including or consisting of a conductive layer and/or a via including or consisting of a conductive material. The above-described conductive material, conductive layer, semiconductor layer, insulating layer, light emitting layer, etc., are disposed on a substrate SUB.

Each layer of a pixel PX may be disposed in the order of the substrate SUB, a buffer layer BF, a first semiconductor layer 100, a first insulating layer 710, a first conductive layer 200, a second insulating layer 720, a second conductive layer 300, a third insulating layer 730, a third conductive layer 400, a first via layer VIA1, a second anode connection electrode CNTE2, a second via layer VIA2, the anode ANO, a pixel defining layer PDL, the light emitting layer EL, and the cathode CAT. Each of the above layers may be a single layer or a stacked layer including a plurality of layers. Another layer may also be disposed between the above layers.

The substrate SUB supports each layer disposed thereon. When an organic light emitting display device is of a bottom emission type or a double-sided emission type, a transparent substrate may be used. When the organic light emitting display device is of a top emission type, not only a transparent substrate but also a translucent or opaque substrate may be applied.

The substrate SUB may include or consist of an insulating material such as glass, quartz, or polymer resin. In an embodiment, the polymer material may be, for example, polyethersulphone ("PES"), polyacrylate ("PA"), polyarylate ("PAR"), polyetherimide ("PEI"), polyethylene naphthalate ("PEN"), polyethylene terephthalate ("PET") polyphenylene sulfide ("PPS"), polyallylate, polyimide ("PI"), polycarbonate ("PC"), cellulose triacetate ("CAT"), cellulose acetate propionate ("CAP"), or any combinations of the same. The substrate SUB may also include a metal material.

The substrate SUB may be a rigid substrate or a flexible substrate that may be bent, folded, or roiled. The material that forms the flexible substrate may be, but is not limited to PI.

The buffer layer BF may be disposed on the substrate SUB. The buffer layer BF may be disposed on the entire surface of the substrate SUB. The buffer layer BF may prevent diffusion of impurity ions, prevent penetration of moisture or outside air, and perform a surface planarization function. The buffer layer BF may include silicon nitride. However, the invention is not limited thereto, and the buffer layer BF may also include silicon oxide or silicon oxynitride. The buffer layer BF may be omitted depending on the type or processing conditions of the substrate SUB.

The first semiconductor layer 100 may be disposed on the buffer layer BF. The first semiconductor layer 100 is an active layer that forms a first area, a second area, and a channel (or a channel area) contacting the first electrode and the second electrode of each of the first through seventh transistors T1 through T7. Any one of the first area and the second area is a source area, and the other is a drain area.

Hereinafter, a right side in a plan view will be also referred to as a first side of the first direction DR1, a left side in a plan view will be also referred to as a second side of the first direction DR1, an upper side in a plan view will be also referred to as a first side of the second direction DR2, and a lower side in a plan view will be also referred to as a second side of the second direction DR2.

The first semiconductor layer 100 may be connected without being separated for each pixel PX. The first semiconductor layer 100 may include a predetermined pattern in a plan view. In an embodiment, the first semiconductor layer 100 may include a first vertical part 110, a second vertical part 120, a third vertical part 150, a fourth vertical part 160 and a fifth vertical part 170 which generally extend in the second direction DR2, a first horizontal part 130 and a second horizontal part 140 which generally extend in the first direction DR1, and first through third connection parts 181 through 183 which connect some of the vertical parts 110, 120, 150, 160 and 170 and the horizontal parts 130 and 140, for example. The vertical parts 110, 120, 150, 160 and 170, the horizontal parts 130 and 140, and the first through third connection parts 181 through 183 may be physically connected to each other.

The first vertical part 110 may be disposed adjacent to a second side of one pixel PX in the first direction DR1, and the second vertical part 120 may be disposed adjacent to a first side of the pixel PX in the first direction DR1. The first vertical part 110 and the second vertical part 120 may be spaced apart from each other. The first vertical part 110 may be longer than the second vertical part 120 in the second direction DR2. The first horizontal part 130 may connect middle parts of the first vertical part 110 and the second vertical part 120. In the specification, "upper parts 111 and 121" of the first vertical part 110 and the second vertical part 120 may refer to parts disposed closer to the first side of the second direction DR2 than the parts connected to the first horizontal part 130 in a plan view, and "lower parts 112 and 122" may refer to parts disposed closer to the second side of the second direction DR2 than the parts connected to the first horizontal part 130 in a plan view. A shape formed or provided by the first vertical part 110, the second vertical part 120, and the first horizontal part 130 in a plan view may be roughly similar to an 'H' shape.

The first horizontal part 130 may connect the first vertical part 110 and the second vertical part 120 with a shortest distance. However, as illustrated in the drawings, the first horizontal part 130 may also include a first bent part 131 on the second side of the first direction DR1 and a second bent part 132 on the first side of the first direction DR1. The total length of the first horizontal part 130 may be increased through multiple times of bending.

The second horizontal part 140 may extend from an end of the upper part 121 of the second vertical part 120 on the first side of the second direction DR2 to the second side of the first direction DR1 and may be disposed closer to the first side of the second direction DR2 than the first horizontal part 130. An area of the second horizontal part 140 on the second side of the first direction DR1 may have a greater width than other areas, but the invention is not limited thereto.

The third vertical part 150, the fourth vertical part 160, and the fifth vertical part 170 may be disposed on a first side of the second horizontal part 140 in the second direction DR2. The third vertical part 150 may be disposed on a second side of the fifth vertical part 170 in the first direction DR1, and the fourth vertical part 160 may be disposed between the third vertical part 150 and the fifth vertical part 170. An end of the fifth vertical part 170 on the second side of the second direction DR2 may be connected to the fourth vertical part 160, but an end of the fifth vertical part 170 on the first side of the second direction DR2 may be connected to the lower part 122 of the second vertical part 120 of another adjacent pixel PX.

The first connection part 181 may be disposed between an end of the second horizontal part 140 on the second side of the first direction DR1 and an end of the third vertical part 150 on the second side of the second direction DR2. The first connection part 181 may connect the second horizontal part 140 and the third vertical part 150 and may be inclined to the first direction DR1 and the second direction DR2.

The second connection part 182 may be disposed between an end of the third vertical part 150 on the first side of the second direction DR2 and an end of the fourth vertical part 160 on the first side of the second direction DR2. The second connection part 182 may connect the third vertical part 150 and the fourth vertical part 160.

The third connection part 183 may be disposed between an end of the fourth vertical part 160 on the second side of the second direction DR2 and the end of the fifth vertical part 170 on the second side of the second direction DR2. The third connection part 183 may connect the fourth vertical part 160 and the fifth vertical part 170.

A shape formed or provided by the third vertical part 150, the fourth vertical part 160, the fifth vertical part 170, the second connection part 182, and the third connection part 183 in a plan view may be roughly similar to an inverted and lying 'S' shape.

A channel of the first transistor T1 may be disposed in the first horizontal part 130. A channel of the second transistor T2 may be disposed in the upper part 111 of the first vertical part 110. A channel of the first sub transistor T3_1 may be disposed in the second horizontal part 140, and a channel of the second sub transistor T3_2 may be disposed in the upper part 121 of the second vertical part 120. A channel of the third sub transistor T4_1 may be disposed in the third vertical part 150, and a channel of the fourth sub transistor T4_2 may be disposed in the fourth vertical part 160. A channel of the fifth transistor T5 may be disposed in the lower part 112 of the first vertical part 110. A channel of the sixth transistor T6 may be disposed in the lower part 122 of the second vertical part 120. A channel of the seventh transistor T7 may be disposed in the fifth vertical part 170.

The first semiconductor layer 100 may include polycrystalline silicon. The polycrystalline silicon may be formed or provided by crystalizing amorphous silicon. Examples of the crystallization method may include, but are not limited to, a rapid thermal annealing ("RTA") method, a solid phase crystallization ("SPC") method, an excimer laser annealing ("ELA") method, a metal induced crystallization ("MIC") method, a metal induced lateral crystallization ("MILC") method, and a sequential lateral solidification ("SLS") method. In another embodiment, the first semiconductor layer 100 may include monocrystaline silicon, low-temperature polycrystalline silicon or amorphous silicon or may include an oxide semiconductor, for example.

The first insulating layer 710 may be disposed on the first semiconductor layer 100 and may be generally disposed over the entire surface of the substrate SUB. The first insulating layer 710 may be a gate insulating layer having a gate insulating function.

A first opening OP1 may be defined in the first insulating layer 710. The first opening OP1 may penetrate the first insulating layer 710 in the thickness direction (third direction DR3). The first opening OP1 may be disposed in a fourth non-overlap area NOA4 to expose the buffer layer BF. The first opening OP1 may be disposed in each pixel. The first opening OP1 may overlap at least any one of the anode ANO and the first semiconductor layer 100. This will be described in detail later.

The first insulating layer 710 may include an inorganic insulating material. In an embodiment, the inorganic insulating material may include at least any one of silicon oxide, silicon nitride, silicon oxynitride, aluminum oxide, tantalum oxide, hafnium oxide, zirconium oxide, and titanium oxide, for example. These materials may be used alone or in combination with each other.

The first conductive layer 200 is disposed on the first insulating layer 710. The first conductive layer (also referred to as a first conductor layer) 200 may include a first scan line 210 which transmits the first scan signal GW (refer to FIG. 3), a gate electrode 240 of the first transistor T1, an emission control line 220 which transmits the emission control signal EM (refer to FIG. 3), and a second scan line 230 which supplies the second scan signal GI (refer to FIG. 3).

The first scan line 210 may include the gate electrodes of the second transistor T2, the first sub transistor T3_1 and the second sub transistor T3_2, and the emission control line 220 may include the gate electrode of the fifth transistor T5 and the gate electrode of the sixth transistor T6. In addition, the second scan line 230 may include the gate electrodes of the third sub transistor T4_1, the fourth sub transistor T4_2, and the seventh transistor T7.

Each of the first scan line 210, the emission control line 220, and the second scan line 230 may extend along the first direction DR1. Each of the first scan line 210, the emission control line 220, and the second scan line 230 may extend beyond the boundary of the pixel PX along the first direction DR1 to neighboring pixels PX.

The first scan line 210 may be disposed near the center of the pixel PX and may overlap the upper part 111 of the first vertical part 110 and the upper part 121 of the second vertical part 120 of the first semiconductor layer 100.

The first scan line 210 may form the gate electrode of the second transistor T2 in a part overlapping the upper part 111 of the first vertical part 110 of the first semiconductor layer 100. The first vertical part 110 of the first semiconductor layer 100 disposed closer to the first side of the second direction DR2 than the overlapping area may be a first area of the second transistor T2, and the first vertical part 110 of the first semiconductor layer 100 disposed closer to the second side of the second direction DR2 than the overlapping area may be a second area of the second transistor T2.

The first scan line 210 may form the gate electrode of the second sub transistor T3_2 in a part overlapping the upper part 121 of the second vertical part 120 of the first semiconductor layer 100. The second vertical part 120 of the first semiconductor layer 100 disposed closer to the first side of the second direction DR2 than the overlapping area may be a second area of the second sub transistor T3_2, and the second vertical part 120 of the first semiconductor layer 100 disposed closer to the second side of the second direction DR2 than the overlapping area may be a first area of the second sub transistor T3_2.

The first scan line 210 may further include a first scan line protruding part 211, The first scan line protruding part 211 may protrude toward the first side of the second direction DR2 from the first scan line 210 extending in the first direction DR1.

The first scan line protruding part 211 may overlap the second horizontal part 140 of the first semiconductor layer 100 and may form the gate electrode of the first sub transistor T3_1 in the overlapping part. The second horizontal part 140 of the first semiconductor layer 100 disposed closer to the first side of the first direction DR1 than the overlapping area may be a first area of the first sub transistor T3_1, and the second horizontal part 140 of the first semiconductor layer 100 disposed closer to the second side of the first direction DR1 than the overlapping area may be a second area of the first sub transistor T3_1.

The emission control line 220 may be disposed on a second side of the pixel PX in the second direction DR2 in a plan view and may overlap the lower part 112 of the first vertical part 110 and the lower part 122 of the second vertical part 120 of the first semiconductor layer 100.

The emission control line 220 may form the gate electrode of the fifth transistor T5 in a part overlapping the lower part 112 of the first vertical part 110 of the first semiconductor layer 100. The first vertical part 110 of the first semiconductor layer 100 disposed closer to the first side of the second direction DR2 than the overlapping area may be a second area of the fifth transistor T5, and the first vertical part 110 of the first semiconductor layer 100 disposed closer to the second side of the second direction DR2 than the overlapping area may be a first area of the fifth transistor T5.

The emission control line 220 may form the gate electrode of the sixth transistor T6 in a part overlapping the upper part 121 of the second vertical part 120. The second vertical part 120 of the first semiconductor layer 100 disposed closer to the first side of the second direction DR2 than the overlapping area may be a first area of the sixth transistor 16, and the second vertical part 120 of the first semiconductor layer 100 disposed closer to the second side of the second direction DR2 than the overlapping area may be a second area of the sixth transistor T6.

The second scan line 230 may be disposed on a first side of the pixel PX in the second direction DR2 in a plan view and may overlap the third vertical part 150, the fourth vertical part 160, and the fifth vertical part 170 of the first semiconductor layer 100.

The second scan line 230 may form the gate electrode of the third sub transistor T4_1 in a part overlapping the third vertical part 150 of the first semiconductor layer 100. The third vertical part 150 of the first semiconductor layer 100 disposed closer to the first side of the second direction DR2 than the overlapping area may be a second area of the third sub transistor T4_1, and the third vertical part 150 of the first semiconductor layer 100 disposed closer to the second side of the second direction DR2 than the overlapping area may be a first area of the third sub transistor T4_1.

The second scan line 230 may form the gate electrode of the fourth sub transistor T4_2 in a part overlapping the fourth vertical part 160 of the first semiconductor layer 100. The fourth vertical part 160 of the first semiconductor layer 100 disposed closer to the first side of the second direction DR2 than the overlapping area may be a first area of the fourth sub transistor T4_2, and the fourth vertical part 160 of the first semiconductor layer 100 disposed closer to the second side of the second direction DR2 than the overlapping area may be a second area of the fourth sub transistor T4_2.

The second scan line 230 may form the gate electrode of the seventh transistor T7 in a part overlapping the fifth vertical part 170 of the first semiconductor layer 100. The fifth vertical part 170 of the first semiconductor layer 100 disposed closer to the first side of the second direction DR2 than the overlapping area may be a second area of the seventh transistor T7, and the fifth vertical part 170 of the first semiconductor layer 100 disposed closer to the second side of the second direction DR2 than the overlapping area may be a first area of the seventh transistor T7.

The gate electrodes of the second through seventh transistors T2 through T7 may be wider than surrounding lines, but the invention is not limited thereto.

The gate electrode 240 of the first transistor T1 may be disposed in the center of the pixel PX. The gate electrode 240 of the first transistor T1 may be disposed between the first scan line 210 and the emission control line 220 in a plan view. The gate electrode 240 of the first transistor T1 may be separated for each pixel PX.

The gate electrode 240 of the first transistor T1 overlaps the first horizontal part 130 of the first semiconductor layer 100. The first horizontal part 130 of the first semiconductor layer 100 disposed closer to the second side of the first direction DR1 than the overlapping part may be a first area of the first transistor T1, and the first horizontal part 130 of the first semiconductor layer 100 disposed closer to the first side of the first direction DR1 than the overlapping part may be a second area of the first transistor T1.

In an embodiment, the first conductive layer 200 may include one or more metals including or consisting of at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 720 insulates the first conductive layer 200 from the second conductive layer 300. The second insulating layer 720 may be disposed on the first conductive layer 200 and may be generally disposed over the entire surface of the substrate SUB. The second insulating layer 720 may be an interlayer insulating film.

A second opening OP2 may be defined in the second insulating layer 720. The second opening OP2 may penetrate the second insulating layer 720 in the thickness direction (third direction DR3). The second opening OP2 may be disposed in a second non-overlap area NOA2 to expose the first conductive layer 200. The second opening OP2 may be disposed in each pixel. The second opening OP2 may overlap at least any one of the anode ANO and the first semiconductor layer 100. This will be described in detail later.

The second insulating layer 720 may include the same material as that of the first insulating layer 710 or may include one or more materials of the materials exemplified as the constituent material of the first insulating layer 710.

The second conductive layer 300 is disposed on the second insulating layer 720. The second conductive layer 300 may include a capacitor electrode line 310 and an initialization voltage line 320 which supplies the initialization voltage VINT (refer to FIG. 3).

Each of the capacitor electrode line 310 and the initialization voltage line 320 may extend along the first direction DR1. Each of the capacitor electrode line 310 and the initialization voltage line 320 may extend beyond the boundary of the pixel PX along the first direction DR1 to the neighboring pixels PX.

The capacitor electrode line 310 crosses the center of the pixel PX and forms the capacitor Cst by overlapping the gate electrode 240 of the first transistor T1 thereunder with the second insulating layer 720 interposed between them. The gate electrode 240 of the first transistor T1 may be the first electrode of the capacitor Cst, an extended area of the capacitor electrode line 310 overlapping the gate electrode 240 of the first transistor T1 may be the second electrode of the capacitor Cst, and the second insulating layer 720 interposed between them may be a dielectric of the capacitor Cst.

A width of the capacitor electrode line 310 may be extended in the area overlapping the gate electrode 240 of the first transistor T1. An opening overlapping the gate electrode 240 of the first transistor T1 under capacitor electrode line 310 may be defined in the capacitor electrode line 310 in the extended area.

The initialization voltage line 320 may be disposed on the first side of the pixel PX in the second direction DR2 in a plan view. The initialization voltage line 320 may overlap the fifth vertical part 170 of the first semiconductor layer 100.

In an embodiment, the second conductive layer 300 may include one or more metals including or consisting of at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer 730 covers the second conductive layer 300. The third insulating layer 730 may be generally disposed over the entire surface of the substrate SUB. The third insulating layer 730 may be an interlayer insulating film.

A third opening OP3 may be defined in the third insulating layer 730. The third opening OP3 may penetrate the third insulating layer 730 in the thickness direction (third direction DR3). The third opening OP3 may be disposed in the second non-overlap area NOA2 and a third non-overlap area NOA3 or at least any one of the second non-overlap area NOA2 and the third non-overlap area NOA3. The third opening OP3 may expose at least any one of the second conductive layer 300 and the first conductive layer 200 in at least any one of the second non-overlap area NOA2 and the third non-overlap area NOA3.

The third opening OP3 may overlap the entire area of the second opening OP2. Sidewalls of the third opening OP3 and sidewalls of the second opening OP2 may be aligned in at least some areas. The third opening OP3 may be disposed in each pixel. The third opening OP3 may overlap at least any one of the anode ANO and the first semiconductor layer 100. This will be described in detail later.

The third insulating layer 730 may include the same material as that of the second insulating layer 720 or may include one or more materials of the materials exemplified as the constituent material of the second insulating layer 720.

The third conductive layer 400 is disposed on the third insulating layer 730. The third conductive layer 400 may include a plurality of data patterns 410 and 420, the anode ANO of the light emitting element LE (refer to FIG. 3), a first anode connection electrode 430 which electrically connects the anode ANO and the first semiconductor layer 100, a first power voltage line 440 which supplies the first power voltage ELVDD (refer to FIG. 3), and a data line 450 which transmits the data signal DATA (refer to FIG. 3).

The data patterns may include a first data pattern 410 and a second data pattern 420. Each of the data patterns 410 and 420 may generally extend in the second direction DR2, and a length of each of the data patterns 410 and 420 in the second direction DR2 may be smaller than a length of the pixel PX in the second direction DR2. The data patterns 410 and 420 may be physically spaced apart from each other. Each of the data patterns 410 and 420 may electrically connect parts spaced apart from each other.

The first data pattern 410 may overlap the gate electrode 240 of the first transistor T1. In the overlapping area, the first data pattern 410 may be electrically connected to the gate electrode 240 of the first transistor T1 through a first contact hole CNT1 penetrating the third insulating layer 730 and the second insulating layer 720 to expose the gate electrode 240 of the first transistor T1. The first contact hole CNT1 may be disposed in the opening of the capacitor electrode line 310. The first data pattern 410 in the first contact hole CNT1 and the capacitor electrode line 310 adjacent to the first data pattern 410 may be insulated from each other by the third insulating layer 730.

In addition, the first data pattern 410 may extend upward from the area overlapping the gate electrode 240 of the first transistor T1 to intersect the first scan line 210 while being insulated from the first scan line 210 and may overlap a part of the second horizontal part 140 of the first semiconductor layer 100. In the overlapping area, the first data pattern 410 may be electrically connected to the second horizontal part 140 of the first semiconductor layer 100 through a second contact hole CNT2 penetrating the third insulating layer 730, the second insulating layer 720 and the first insulating layer 710 to expose a part of the second horizontal part 140 of the first semiconductor layer 100. The part of the second horizontal part 140 may be, but is not limited to, the second area of the first sub transistor T3_1.

In other words, the first data pattern 410 may electrically connect the gate electrode 240 of the first transistor T1 and the second horizontal part 140 of the first semiconductor layer 100.

The second data pattern 420 may overlap the third connection part 183 of the first semiconductor layer 100. In the overlapping area, the second data pattern 420 may be electrically connected to the third connection part 183 of the first semiconductor layer 100 through a fourth contact hole CNT4 penetrating the third insulating layer 730, the second insulating layer 720 and the first insulating layer 710 to expose the third connection part 183 of the first semiconductor layer 100.

In addition, the second data pattern 420 may extend upward from the area overlapping the third connection part 183 of the first semiconductor layer 100 to intersect the second scan line 230 while being insulated from the second scan line 230 and may overlap the initialization voltage line 320. In the overlapping area, the second data pattern 420 may be electrically connected to the initialization voltage line 320 through a fifth contact hole CNT5 penetrating the third insulating layer 730 to expose the initialization voltage line 320.

In other words, the second data pattern 420 may electrically connect the third connection part 183 of the first semiconductor layer 100 and the initialization voltage line 320.

The first anode connection electrode 430 generally extends in the second direction DR2, but a length of the first anode connection electrode 430 in the second direction DR2 is smaller than the length of the pixel PX in the second direction DR2. The first anode connection electrode 430 is physically spaced apart from the data patterns 410 and 420. The first anode connection electrode 430 may connect the first semiconductor layer 100 to the anode ANO together with the second anode connection electrode CNTE2 to be described later.

The first anode connection electrode 430 may overlap the lower part 122 of the second vertical part 120 of the first semiconductor layer 100. The first anode connection electrode 430 may be electrically connected to the lower part 122 of the second vertical part 120 of the first semiconductor layer 100 through a sixth contact hole CNT6 penetrating the third insulating layer 730, the second insulating layer 720 and the first insulating layer 710 to expose the lower part 122 of the second vertical part 120 of the first semiconductor layer 100.

The first power voltage line 440 may extend along the second direction DR2. The first power voltage line 440 may extend beyond the boundary of the pixel PX along the second direction DR2 to neighboring pixels PX. The first power voltage line 440 may be generally disposed adjacent to a left side of the pixel PX but on a first side of the data line 450 in the first direction DR1, but the invention is not limited thereto. The first power voltage line 440 may be electrically connected to the capacitor electrode line 310 through an eighth contact hole CNT8 penetrating the third insulating layer 730 to expose the capacitor electrode line 310.

In addition, the first power voltage line 440 may be electrically connected to the lower part 112 of the first vertical part 110 of the first semiconductor layer 100 through a seventh contact hole CNT7 penetrating the third insulating layer 730, the second insulating layer 720 and the first insulating layer 710 to expose the lower part 112 of the first vertical part 110 of the first semiconductor layer 100.

The data line 450 may extend along the second direction DR2. The data line 450 may extend beyond the boundary of the pixel PX along the second direction DR2 to the neighboring pixels PX. The data line 450 may be disposed adjacent to the second side of the pixel PX in the first direction DR1. The data line 450 may overlap the first vertical part 110 of the first semiconductor layer 100.

The data line 450 may contact the upper part 111 of the first vertical part 110 of the first semiconductor layer 100 through a third contact hole CNT3 penetrating the third insulating layer 730, the second insulating layer 720 and the first insulating layer 710 to expose the upper part 111 of the first vertical part 110 of the first semiconductor layer 100. The third contact hole CNT3 may be disposed below the second scan line 230 in a plan view, but the invention is not limited thereto.

In an embodiment, the third conductive layer 400 may include one or more metals including or consisting of at least one of molybdenum (Mo), aluminum (Al), platinum (Pt), palladium (Pd), silver (Ag), magnesium (Mg), gold (Au), nickel (Ni), neodymium (Nd), (Ir), chromium (Cr), calcium (Ca), titanium (Ti), tantalum (Ta), tungsten (W), and copper (Cu). The third conductive layer 400 may be a single layer or a multilayer. In an embodiment, the third conductive layer 400 may have a stacked structure of Ti/Al/Ti, Mo/Al/Mo, Mo/AlGe/Mo, or Ti/Cu, for example.

The first via layer VIA1 is disposed on the third conductive layer 400. The first via layer VIA1 may be a planarization layer. In an embodiment, the first via layer VIA1 may include an inorganic insulating material or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene ("BCB").

The second anode connection electrode CNTE2 is disposed on the first via layer VIA1. In an embodiment, the second anode connection electrode CNTE2 may include one or more metals including or consisting of at least one of molybdenum (Mo), aluminum (Al), platinum (Pt), palladium (Pd), silver (Ag), magnesium (Mg), gold (Au), nickel (Ni), neodymium (Nd), (Ir), chromium (Cr), calcium (Ca), titanium (Ti), tantalum (Ta), tungsten (W), and copper (Cu).

A first anode contact hole ACNT1 may be defined in the first via layer VIA1 to penetrate the first via layer VIA1 and expose the first anode connection electrode 430. The second anode connection electrode CNTE2 may be connected to the first anode connection electrode 430 through the first anode contact hole ACNT1.

The second via layer VIA2 is disposed on the second anode connection electrode CNTE2. The second via layer VIA2 may be a planarization layer. In an embodiment, the second via layer VIA2 may include an inorganic insulating material or an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene ("BCB").

The anode ANO is disposed on the second via layer VIA2. The anode ANO may be disposed separately for each pixel PX. The anode ANO may be electrically connected to the second anode connection electrode CNTE2 through a second anode contact hole ACNT2 penetrating the second via layer VIA2 to expose the second anode connection electrode CNTE2.

In an embodiment, the anode ANO may have, but is not limited to, a stacked structure in which a material layer having a high work function such as indium tin oxide ("ITO"), indium zinc oxide ("IZO"), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or any combinations of the same are stacked. The material layer having a high work function may be disposed on the reflective material layer so that it is close to the light emitting layer EL. In an embodiment, the anode ANO may have, but is not limited to, a multilayer structure of ITO/Mg, ITO/MgF, ITO/Ag, or ITO/Ag/ITO.

The pixel defining layer PDL may be disposed on the anode ANO. An opening that partially exposes the anode ANO may be defined in the pixel defining layer PDL. The pixel defining layer PDL may include or consist of an organic insulating material or an inorganic insulating material. In an embodiment, the pixel defining layer PDL may include at least one of polyimide resin, acrylic resin, a silicone compound, and poly acrylic resin, for example.

The light emitting layer EL is disposed on the anode ANO exposed by the pixel defining layer PDL. The light emitting layer EL may include an organic material layer. The organic material layer of the light emitting layer EL may include an organic light emitting layer and may further include a hole injection/transport layer and/or an electron injection/transport layer.

The cathode CAT may be disposed on the light emitting layer EL. The cathode CAT may be a common electrode disposed over the entire surface without distinction between the pixels PX. The anode ANO, the light emitting layer EL and the cathode CAT may constitute organic light emitting element.

In an embodiment, the cathode CAT may include a material layer having a small work function, such as Li, Ca, LiF/Ca, LiF/Al, Al, Mg, Ag, N, Pd, Ni, Au Nd, Ir, Cr, BaF, Ba, or any compounds or combinations of the same (e.g., a combination of Ag and Mg). The cathode CAT may further include a transparent metal oxide layer disposed on the material layer having a small work function.

The anode ANO, the light emitting layer EL, and the cathode CAT may constitute the light emitting element LE (refer to FIG. 3).

A thin-film encapsulation layer 770 including a first inorganic insulating layer 771, a first organic layer 772 and a second inorganic insulating layer 773 is disposed on the cathode CAT. The first inorganic insulating layer 771 and the second inorganic insulating layer 773 may contact each other at an end of the thin-film encapsulation layer 770. The first organic layer 772 may be sealed by the first inorganic insulating layer 771 and the second inorganic insulating layer 773.

Each of the first inorganic insulating layer 771 and the second inorganic insulating layer 773 may include silicon nitride, silicon oxide, or silicon oxynitride. The first organic layer 772 may include an organic insulating material.

In the pixel PX, at least a part of an inorganic insulating layer may be removed. In an embodiment, the inorganic insulating layer may include, but is not limited to, the first through third insulating layers 710, 720 and 730, for example. Accordingly, in each pixel PX, the inorganic insulating layer may expose at least a part of any one of the first conductive layer 200, the second conductive layer 300, and the third conductive layer 400. In area in which the conductive layers 200, 300 and 400 overlap with one of the others, a conductive layer disposed at the top in the thickness direction (third direction DR3) among the conductive layers may be exposed.

In area in which the conductive layers 200, 300 and 400 overlap with one of the others, an insulating layer disposed under the conductive layer disposed at the top may be disposed. In an embodiment, the second insulating layer 720 may be disposed in an area in which the first conductive layer 200 and the second conductive layer 300 overlap, the second insulating layer 720 and the third insulating layer 730 may be disposed in an area in which the first conductive layer 200 and the third conductive layer 400 overlap, and the third insulating layer 730 may be disposed in an area in which the second conductive layer 300 and the third conductive layer 400 overlap, for example.

In an area overlapping the first semiconductor layer 100, at least any one of the insulating layers 710, 720 and 730 and the conductive layers 200, 300 and 400 may be disposed on the first semiconductor layer 100. In an area not overlapping the first semiconductor layer 100 and the conductive layers 200, 300 and 400, the insulating layers 710, 720 and 730 may all be removed.

The first semiconductor layer 100 may not be exposed by an inorganic insulating layer or a conductive layer. In other words, the first semiconductor layer 100 may overlap at least any one of the first conductive layer 200, the second conductive layer 300, the third conductive layer 400, the first insulating layer 710, the second insulating layer 720 and the third insulating layer 730 and may be covered by at least any one of the first conductive layer 200, the second conductive layer 300, the third conductive layer 400, the first insulating layer 710, the second insulating layer 720 and the third insulating layer 730.

However, the entire area of the first semiconductor layer 100 may not necessarily be covered by any one of the first conductive layer 200, the second conductive layer 300, the third conductive layer 400, the first insulating layer 710, the second insulating layer 720 and the third insulating layer 730, and a different element may also cover the first semiconductor layer 100 in each area of the first semiconductor layer 100.

The pixel PX may further include a first non-overlap area NOA1, the second non-overlap area NOA2, the third non-overlap area NOA3, and a fourth non-overlap area NOA4.

In the first non-overlap area NOA1, the first semiconductor layer 100 may not overlap the first through third conductive layers 200, 300 and 400. In the first non-overlap area NOA1, at least any one of the first insulating layer 710, the second insulating layer 720 and the third insulating layer 730 may be disposed on the first semiconductor layer 100.

In the second non-overlap area NOA2, the first conductive layer 200 may not overlap the second conductive layer 300 and the third conductive layer 400. In the second non-overlap area NOA2, the second insulating layer 720 and the third insulating layer 730 may expose the second conductive layer 300. In the second non-overlap area NOA2, at least a part of each of the second insulating layer 720 and the third insulating layer 730 may be removed, and the second conductive layer 300 may be exposed in the removed part of each of the second insulating layer 720 and the third insulating layer 730. In an alternative embodiment, in the second non-overlap area NOA2, at least a part of each of the second insulating layer 720 and the third insulating layer 730 may be penetrated in the thickness direction (third direction DR3) to expose the second conductive layer 300.

In the second non-overlap area NOA2, the removed part of each of the second insulating layer 720 and the third insulating layer 730 may be filled with the first via layer VIA1. In this case, in the second non-overlap area NOA2, the second conductive layer 300 exposed by the second insulating layer 720 and the third insulating layer 730 may directly contact the first via layer VIA1, but the invention is not limited thereto.

The second opening OP2 of the second insulating layer 720 and the third opening OP3 of the third insulating layer 730 may be disposed in the second non-overlap area NOA2 and may overlap each other. The second opening OP2 of the second insulating layer 720 and the third opening OP3 of the third insulating layer 730 may expose the first conductive layer 200 in the second non-overlap area NOA2. The second opening OP2 of the second insulating layer 720 and the third opening OP3 of the third insulating layer 730 may be filled with the first via layer VIA1 in the second non-overlap area NOA2.

In the third non-overlap area NOA3, the second conductive layer 300 may not overlap the third conductive layer 400. In the third non-overlap area NOA3, the third insulating layer 730 may expose the third conductive layer 400. In the third non-overlap area NOA3, at least a part of the third insulating layer 730 may be removed, and the third conductive layer 400 may be exposed in the removed part of the third insulating layer 730. In an alternative embodiment, in the third non-overlap area NOA3, at least a part of the third insulating layer 730 may be penetrated in the thickness direction (third direction DR3) to expose the third conductive layer 400.

A thickness of the third insulating layer 730 disposed in an area overlapping the third conductive layer 400 may be greater than a thickness of the third insulating layer 730 disposed in an area not overlapping the third conductive layer 400. Here, the thickness of the third insulating layer 730 may denote an average thickness of the third insulating layer 730 in each of the areas. A difference in thickness depending on the presence or absence of the third conductive layer 400 may be because a part exposed without being covered by the third conductive layer 400 is partially etched in a process of patterning the third conductive layer 400, but the invention is not limited thereto.

In the third non-overlap area NOA3, the removed part of the third insulating layer 730 may be filled with the first via layer VIAL In this case, in the third non-overlap are NOA3, the third conductive layer 400 exposed by the third insulating layer 730 may directly contact the first via layer VIA1, but the invention is not limited thereto.

The third opening OP3 of the third insulating layer 730 may be disposed in the third non-overlap area NOA3. The third opening OP3 of the third insulating layer 730 may expose the second conductive layer 300 in the third non-overlap area NOA3. The third opening OP3 of the third insulating layer 730 may be filled with the first via layer VIA1 in the third non-overlap area NOA3.

In the fourth non-overlap area NOA4, the substrate SUB may not overlap the first through third conductive layers 200, 300 and 400 and the first semiconductor layer 100.

In the fourth non-overlap area NOA4, at least a part of each of the first through third conductive layers 200, 300 and 400 may be removed, and the first semiconductor layer 100 may not be disposed. In an area in which the first through third conductive layers 200, 300 and 400 are removed and the first semiconductor layer 100 is not disposed, the buffer layer BF may be exposed. In an alternative embodiment, in the fourth non-overlap area NOA4, at least a part of each of the first through third conductive layers 200, 300 and 400 may be penetrated in the thickness direction (third direction DR3), and the first semiconductor layer 100 may not be disposed, thereby exposing the buffer layer BF. However, the invention is not limited thereto. In the fourth non-overlap area NOA4, the buffer layer BF may also be removed to expose the substrate SUB.

In the fourth non-overlap area NOA4, the removed part of each of the first through third conductive layers 200, 300 and 400 may be filled with the first via layer VIAL In this case, in the fourth non-overlap area NOA4, the buffer layer BF exposed by the first through third conductive layers 200, 300 and 400 and the first semiconductor layer 100 may directly contact the first via layer VIA1, but the invention is not limited thereto.

The first opening OP1 of the first insulating layer 710, the second opening OP2 of the second insulating layer 720, and the third opening OP3 of the third insulating layer 730 may be disposed in the fourth non-overlap area NOA4. The first opening OP1 of the first insulating layer 710, the second opening OP2 of the second insulating layer 720, and the third opening OP3 of the third insulating layer 730 may expose the buffer layer BF in the fourth non-overlap area NOA4. The first opening OP1 of the first insulating layer 710 may be filled with the first via layer VIA1 in the fourth non-overlap area NOA4.

The above description of the pixel PX may be applied to at least some of the pixels PX of the display device 1 (refer to FIG. 1). In an embodiment, the above description of the pixel PX may be applied to all pixels of the display device 1 (refer to FIG. 1), for example, but the invention is not limited thereto. That is, each of the inorganic insulating layers of all pixels of the display device 1 (refer to FIG. 1) may expose at least a part of a conductive layer, but the invention is not limited thereto.

Since the insulating layers 710, 720 and 730 overlapping the conductive layers 200, 300 and 400 and disposed on the first through third conductive layers 200, 300 and 400 are removed, the transmission of external impact by an inorganic insulating layer may be suppressed or prevented. The external impact may be, but is not limited to, the impact of dropping the display device 1 (refer to FIG. 1), the impact of dropping a touch input member (a touch pen or a finger) onto the display device 1 (refer to FIG. 1) (a touch pen drop), or the impact of a touch of a touch input member.

In other words, the impact applied from the outside may be transmitted mainly through an inorganic insulating layer (e.g., each insulating layer 710, 720 or 730). In this case, since a part of the inorganic insulating layer which overlaps a conductive layer 200, 300 or 400 is removed, an area in which the inorganic insulating layer is disposed may be minimized, and each inorganic insulating layer may include a discontinuous part in at least some areas.

Therefore, since the transmission of external impact to the first semiconductor layer 100 through an inorganic insulating layer may be suppressed or prevented, the occurrence of defects such as dark spots or bright spots may be suppressed or prevented. Furthermore, the reliability of the display device 1 (refer to FIG. 1) may be improved. However, the insulating layers 710, 720 and 730 in an area overlapping the first semiconductor layer 100 may not be removed. Accordingly, damage that may be done to the first semiconductor layer 100 in the process of removing the insulating layers 710, 720 and 730 may be minimized.

In addition, when the display device 1 (refer to FIG. 1) is a flexible display device that may be bent, folded or rolled, flexible properties of the display device 1 (refer to FIG. 1) may be improved because an area in which the inorganic insulating layer is disposed is minimized.

A method of manufacturing a display device in an embodiment will now be described with reference to FIGS. 7 through 10.

FIGS. 7 through 10 are cross-sectional views illustrating an embodiment of processes in a method of manufacturing a display device.

Figure 7:
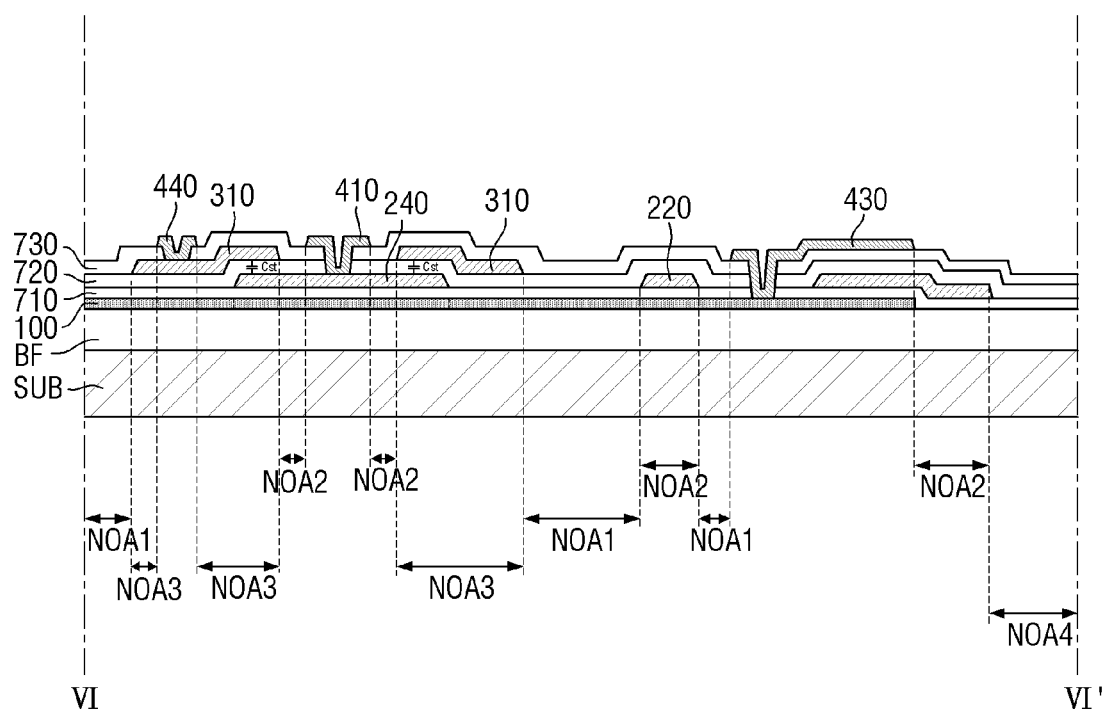
FIGS. 7 through 10 are cross-sectional views illustrating an embodiment of processes in a method of manufacturing a display device.

Referring to FIG. 7, a buffer layer BF, a first semiconductor layer 100, a first insulating layer 710, a first conductive layer 200 (refer to FIG. 4), a second insulating layer 720, a second conductive layer 300 (refer to FIG. 4), a third insulating layer 730, and a third conductive layer 400 (refer to FIG. 4) are sequentially formed or disposed on a substrate SUB.

Specifically, the buffer layer BF may be disposed over the entire area of the substrate SUB. The first semiconductor layer 100, the first insulating layer 710, the first conductive layer 200, the second insulating layer 720, the second conductive layer 300, the third insulating layer 730, and the third conductive layer 400 may be patterned by placing a material layer for forming each of the above layers over the entire area of the buffer layer BF (or the substrate SUB) and then etching the material layer. In a process of etching each of the above layers, an etch mask may be used. In addition, a process of defining a contact hole may be performed before each of the conductive layers 200, 300 and 400 is patterned.

Accordingly, the buffer layer BF, the first semiconductor layer 100, the first insulating layer 710, the first conductive layer 200, the second insulating layer 720, the second conductive layer 300, the third insulating layer 730, and the third conductive layer 400 disposed on the substrate SUB as illustrated in FIG. 7 may be formed or provided.

In FIG. 7, the first insulating layer 710 may overlap and cover the entire area of the first semiconductor layer 100. The second insulating layer 720 may overlap and cover the entire area of the second conductive layer 300 excluding an area in which a contact hole is defined. The third insulating layer 730 may overlap and cover the entire area of the third conductive layer 400 excluding an area in which a contact hole is defined.

In addition, in a process of patterning the third conductive layer 400, a part of the third insulating layer 730 in an area not covered by the third conductive layer 400 may be etched. Accordingly, a thickness of the third insulating layer 730 disposed in an area overlapping the third conductive layer 400 may be greater than a thickness of the third insulating layer 730 disposed in an area not overlapping the third conductive layer 400.

Figure 8:
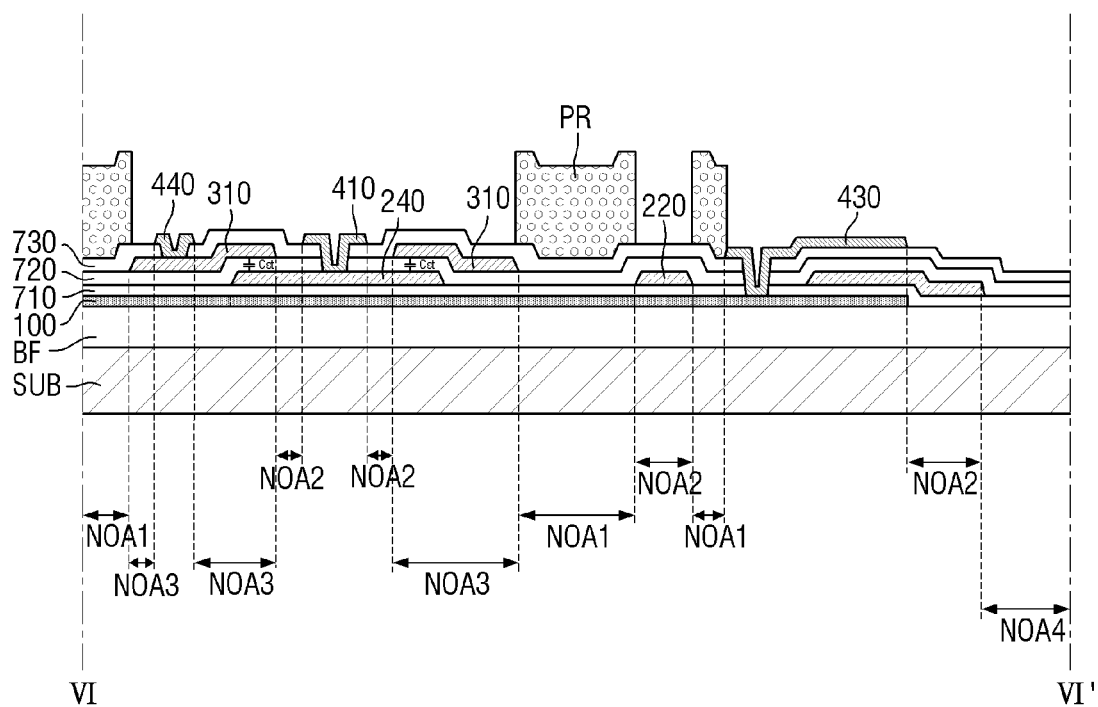

Next, referring to FIG. 8, a photoresist pattern PR is disposed in a first non-overlap area NOA1. A material layer for forming a photoresist pattern is applied on the third insulating layer 730 to cover the third conductive layer 400 and then exposed and developed to form the photoresist pattern PR. The photoresist pattern PR may be disposed in the first non-overlap area NOA1. However, the invention is not limited thereto, and the photoresist pattern PR may also overlap at least a part of the third conductive layer 400.

Figure 9:
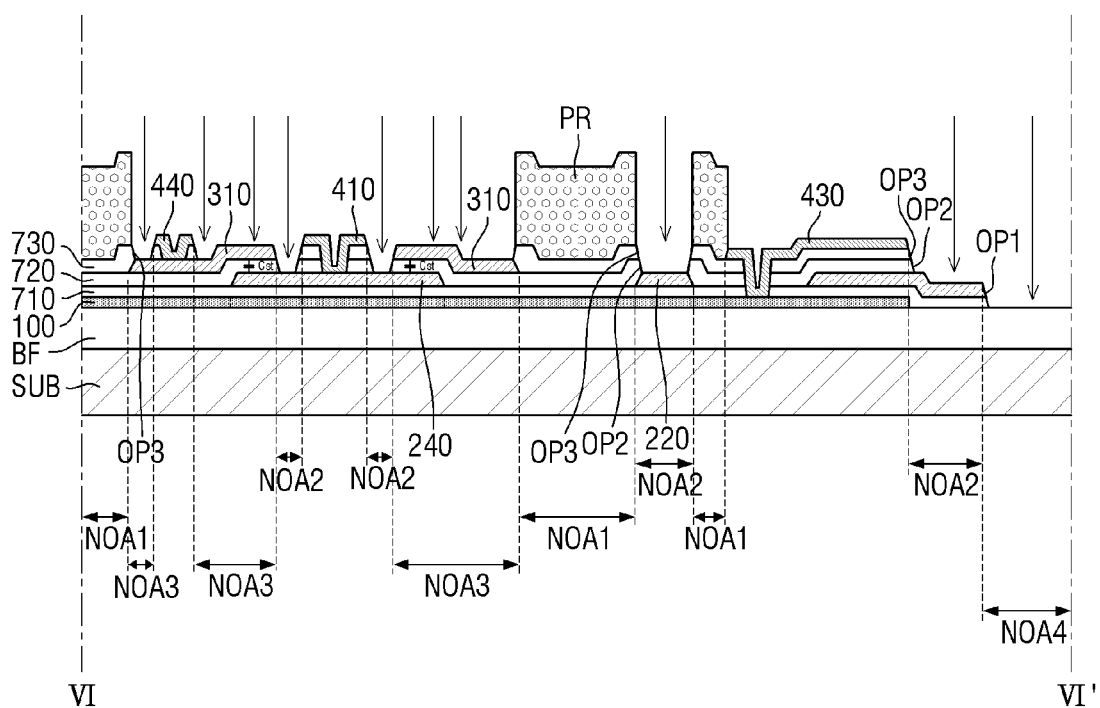

Next, referring to FIG. 9, the third insulating layer 730, the second insulating layer 720, and the first insulating layer 710 are etched using the photoresist pattern PR as an etch mask.

Specifically, when the photoresist pattern PR is used as an etch mask, the insulating layers 730, 720 and 710 in an area in which the photoresist pattern PR is not disposed may be etched. In addition, the conductive layers 200, 300 and 400 may serve as an etch mask in the process in which the insulating layers 730, 720 and 710 are etched. Therefore, the insulating layers 730, 720 and 710 in the area in which the photoresist pattern PR is not disposed may be etched, but the insulating layers 730, 720 and 710 overlapping the conductive layers 200, 300 and 400 and disposed under the conductive layers 200, 300 and 400 may not be etched. Accordingly, a first opening OP1, a second opening OP2, and a third opening OP3 may be defined.

For example, the third insulating layer 730 may be etched in a second non-overlap area NOA2, a third non-overlap area NOA3 and a fourth non-overlap area NOA4 and may not be etched in the first non-overlap area NOA1. In addition, the third insulating layer 730 may not be etched in an area overlapping the third conductive layer 400.

The second insulating layer 720 may be etched in the second non-overlap area NOA2 and the fourth non-overlap area NOA4 and may not be etched in the first non-overlap area NOA1 and the third non-overlap area NOA3. In addition, the second insulating layer 720 may not be etched in an area overlapping at least any one of the second conductive layer 300 and the third conductive layer 400.

The first insulating layer 710 may be etched in the fourth non-overlap area NOA4 and may not be etched in the first non-overlap area NOA1, the second non-overlap area NOA2 and the third non-overlap area NOA3. In addition, the second insulating layer 720 may not be etched in an area overlapping at least any one of the first conductive layer 200, the second conductive layer 300 and the third conductive layer 400.

The process of etching the third insulating layer 730, the second insulating layer 720, and the first insulating layer 710 may be performed by, but not limited to, a dry etching process.

After the etching of the third insulating layer 730, the second insulating layer 720 and the first insulating layer 710 is completed, the photoresist pattern PR is removed through a stripping or ashing process.

Figure 10:
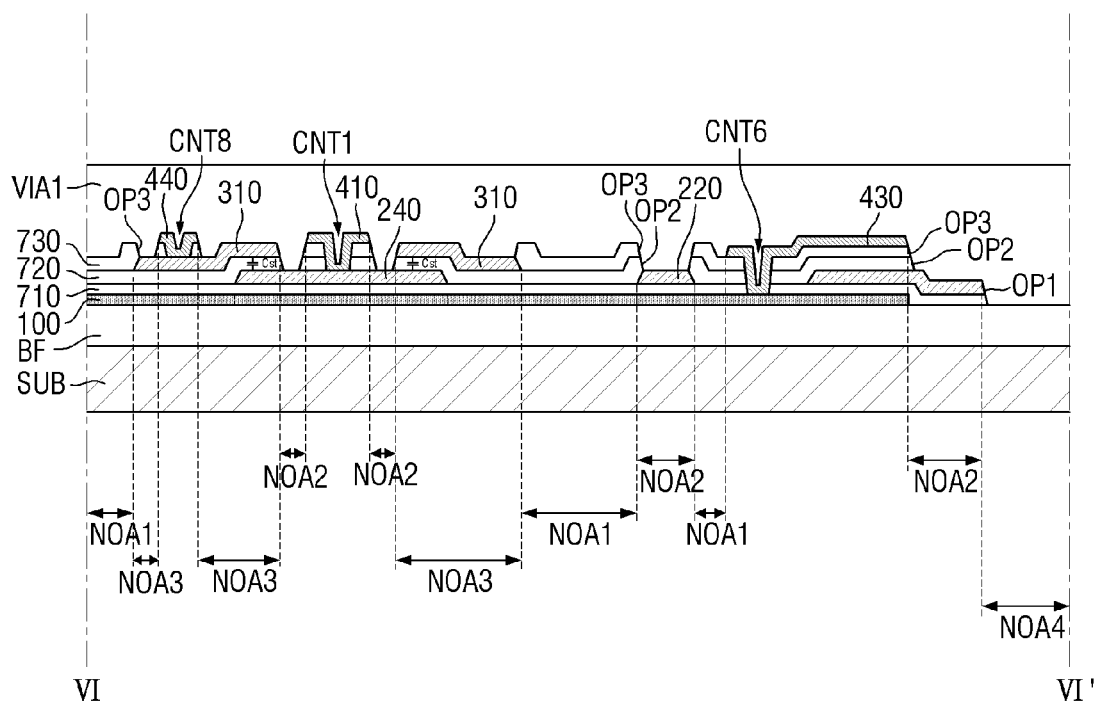

Next, referring to FIG. 10, a first via layer VIA1 is formed or disposed on the third conductive layer 400. The first via layer VIA1 may be disposed over the entire area of the substrate SUB. The first via layer VIA1 may fill etched parts of the insulating layers 710, 720 and 730.

For example, the first via layer VIA1 may fill etched parts of the second insulating layer 720 and the third insulating layer 730 in the second non-overlap area NOA2. The first via layer VIA1 may fill an etched part of the third insulating layer 730 in the third non-overlap area NOA3. The first via layer VIA1 may fill etched parts of the first insulating layer 710, the second insulating layer 720 and the third insulating layer 730 in the fourth non-overlap area NOA4.

Hereinafter, other embodiments will be described. In the following embodiments, a description of the same elements as those described above will be omitted or given briefly, and differences will be mainly described.

Figure 11:
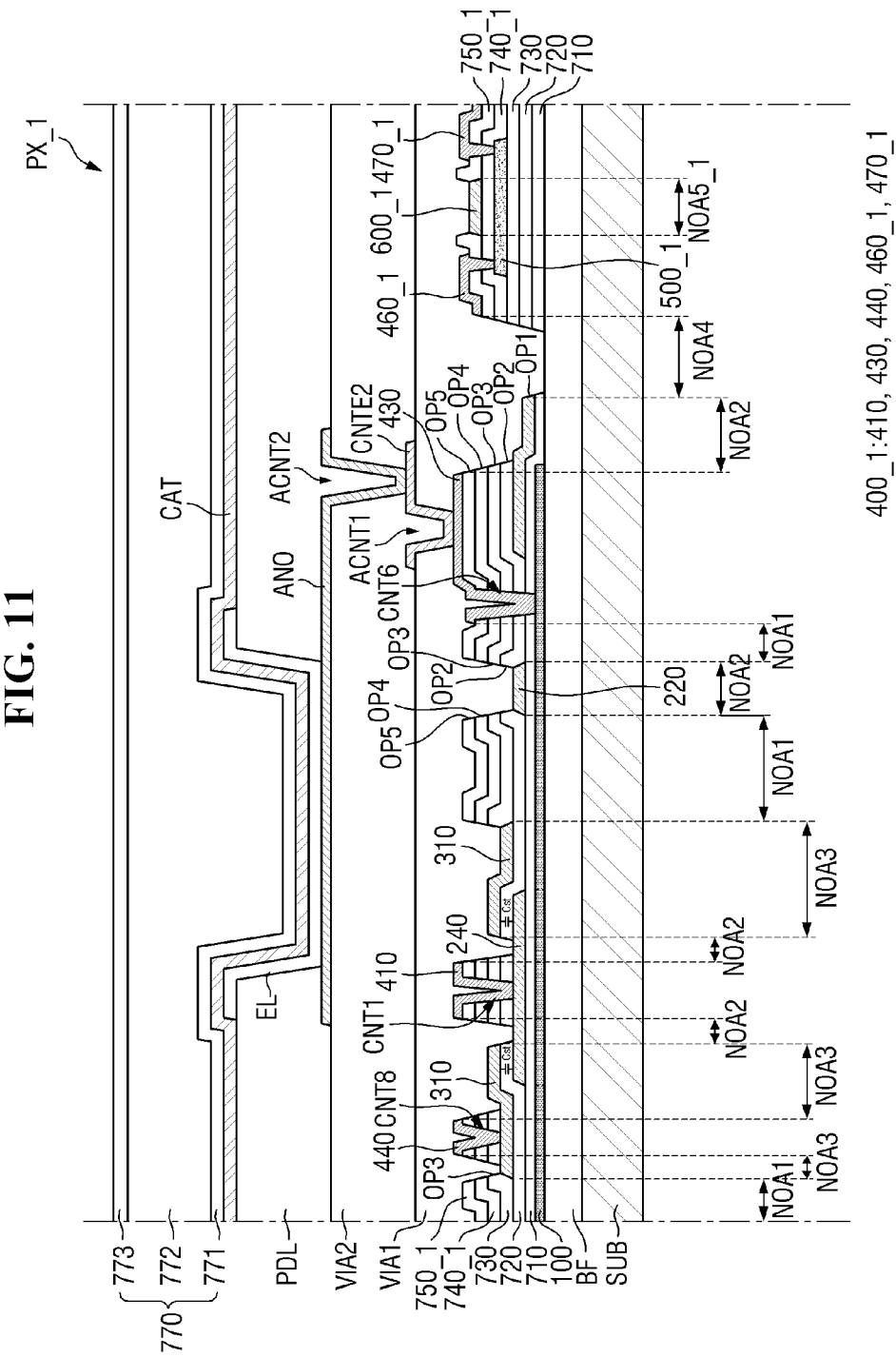
FIG. 11 is a cross-sectional view of an embodiment of a display device.

FIG. 11 is a cross-sectional view of an embodiment of a display device including a pixel PX_1.

Referring to FIGS. 3 and 11, the display device in the illustrated embodiment is different from the embodiment of FIG. 6 in that it further includes a second semiconductor layer 500_1.

Specifically, the display device in the illustrated embodiment may further include the second semiconductor layer 500_1 including a different material from a first semiconductor layer 100. An active layer of at least any one of first through seventh transistors T1 through T7 may include the second semiconductor layer 500_1.

For example, an active layer that forms a channel of each of the first transistor T1, the second transistor T2, the fifth transistor T5, the sixth transistor T6, and the seventh transistor T7 may include the first semiconductor layer 100, and an active layer that forms a channel of each of the third transistor T3 and the fourth transistor T4 may include the second semiconductor layer 500_1. That is, the first semiconductor layer 100 may include the active layers of the first transistor T1, the second transistor T2, the fifth transistor T5, the sixth transistor T6 and the seventh transistor T7, and the second semiconductor layer 500_1 may include the active layers of the third transistor T3 and the fourth transistor T4, but the invention is not limited thereto. In this case, the first transistor T1, the second transistor T2, the fifth transistor T5, the sixth transistor T6 and the seventh transistor T7 are PMOS transistors. The third transistor T3 and the fourth transistor T4 may be NMOS transistors.

The second semiconductor layer 500_1 may be disposed on a third insulating layer 730. The second semiconductor layer 500_1 may be disposed between the third insulating layer 730 and a third conductive layer 400_1. The second semiconductor layer 500_1 may not overlap the first semiconductor layer 100, but the invention is not limited thereto.

The second semiconductor layer 500_1 may include an oxide semiconductor. In an embodiment, the second semiconductor layer 500_1 may include a binary compound (ABx), a ternary compound (ABxCy) or a quaternary compound (ABxCyDz) including indium (In), zinc (Zn), gallium (Ga), tin (Sn), titanium (Ti), aluminum (Al), hafnium (Hf), zirconium (Zr), magnesium (Mg), etc., for example. In an embodiment, the second semiconductor layer 500_1 may include an oxide including indium, titanium and zinc, i.e., indium tin zinc oxide ("ITZO") or an oxide including indium, gallium and zinc, i.e., indium gallium zinc oxide ("IGZO").

The display device may further include a fourth insulating layer 740_1 disposed on the second semiconductor layer 500_1, a fourth conductive layer 600_1 disposed on the fourth insulating layer 740_1, and a fifth insulating layer 750_1 disposed on the fourth conductive layer 600_1. The fourth insulating layer 740_1, the fourth conductive layer 600_1, and the fifth insulating layer 750_1 may be disposed between the second semiconductor layer 500_1 and the third conductive layer 400_1. The fourth insulating layer 740_1 may be a gate insulating layer, and the fifth insulating layer 750_1 may be an interlayer insulating film.

A fourth opening OP4 may be defined in the fourth insulating layer 740_1, and a fifth opening OP5 may be defined in the fifth insulating layer 750_1. The fourth opening OP4 may penetrate the fourth insulating layer 740_1 in the thickness direction (third direction DR3), and the fifth opening OP5 may penetrate the fifth insulating layer 750_1 in the thickness direction (third direction DR3).

The fifth opening OP5 may be disposed in a fifth non-overlap area NOA5_1 and may overlap at least any one of first through fourth openings OP1 through OP4. The fifth opening OP5 may expose the fourth conductive layer 600_1 in the fifth non-overlap area NOA5_1. The fourth opening OP4 may overlap at east any one of the first through third openings OP1 through OP3.

In this case, in a first non-overlap area NOA1, the fourth insulating layer 740_1 and the fifth insulating layer 750_1 may be further disposed on the third insulating layer 730. The fourth insulating layer 740_1 and the fifth insulating layer 750_1 may be further disposed between the third insulating layer 730 and the third conductive layer 400_1. In an area in which at least any one of a first conductive layer 200 and a second conductive layer 300 is exposed by an inorganic insulating layer, the fourth insulating layer 740_1 and the fifth insulating layer 750_1 may be further removed. In addition, in a fourth non-overlap area NOA4 in which a buffer layer BF is exposed, the fourth insulating layer 740_1 and the fifth insulating layer 750_1 may be further removed.

The fourth conductive layer 600_1 may overlap at least a part of the second semiconductor layer 500_1 in the thickness direction (third direction DR3). When the second semiconductor layer 500_1 includes the active layers of the third transistor T3 and the fourth transistor T4, the fourth conductive layer 600_1 may include gate electrodes of the third transistor T3 and the fourth transistor T4 in the above overlapping part.

When the second semiconductor layer 500_1 includes the active layers of the third transistor T3 and the fourth transistor T4, the third conductive layer 400_1 may further include a first electrode and a second electrode of each of the third transistor T3 and the fourth transistor T4. Although only a first electrode 460_1 and a second electrode 470_1 of the fourth transistor T4 are illustrated in FIG. 11, the invention is not limited thereto. The first electrode 460_1 and the second electrode 470_1 may contact the second semiconductor layer 500_1 through a contact hole penetrating the fourth insulating layer 740_1 and the fifth insulating layer 750_1.

The display device in the illustrated embodiment may further include the fifth non-overlap area NOA5_1. In the fifth non-overlap area NOA5_1, the fourth conductive layer 600_1 may not overlap the third conductive layer 400_1. In the fifth non-overlap area NOA5_1, the fourth conductive layer 600_1 may be exposed by the fifth insulating layer 750_1. In other words, in the fifth non-overlap area NOA5_1, at least a part of the fifth insulating layer 750_1 may be removed, and the fourth conductive layer 600_1 may be exposed in the removed part of the fifth insulating layer 750_1, in an alternative embodiment, in the fifth non-overlap area NOA5_1, at least a part of the fifth insulating layer 750_1 may be penetrated in the thickness direction (third direction DR3) to expose the fourth conductive layer 600_1.

In the fifth non-overlap area NOA5_1, the removed part of the fifth insulating layer 750_1 may be filled with a first via layer VIA1. In this case, in the fifth non-overlap area NOA5_1, the fourth conductive layer 600_1 exposed by the fifth insulating layer 750_1 may directly contact the first via layer VIA1, but the invention is not limited thereto.

The second semiconductor layer 500_1 may not be exposed by an inorganic insulating layer or a conductive layer. The entire area of the second semiconductor layer 500_1 may be overlapped by at least any one of the fourth insulating layer 740_1, the fifth insulating layer 750_1, the third conductive layer 400_1, and the fourth conductive layer 600_1 in the thickness direction (third direction DR3). The entire area of second semiconductor layer 500_1 may be covered by at least any one of the fourth insulating layer 740_1, the fifth insulating layer 750_1, the third conductive layer 400_1, and the fourth conductive layer 600_1.

However, the entire area of the second semiconductor layer 500_1 may not necessarily be covered by any one of the fourth insulating layer 740_1, the fifth insulating layer 750_1, the third conductive layer 400_1 and the fourth conductive layer 600_1, and a different element may also cover the second semiconductor layer 500_1 in each area of the second semiconductor layer 500_1.

The fourth insulating layer 740_1 may be disposed between the second semiconductor layer 500_1 and the fourth conductive layer 600_1, and the fourth insulating layer 740_1 and the fifth insulating layer 750_1 may be disposed between the second semiconductor layer 500_1 and the third conductive layer 400_1.

Figure 12:
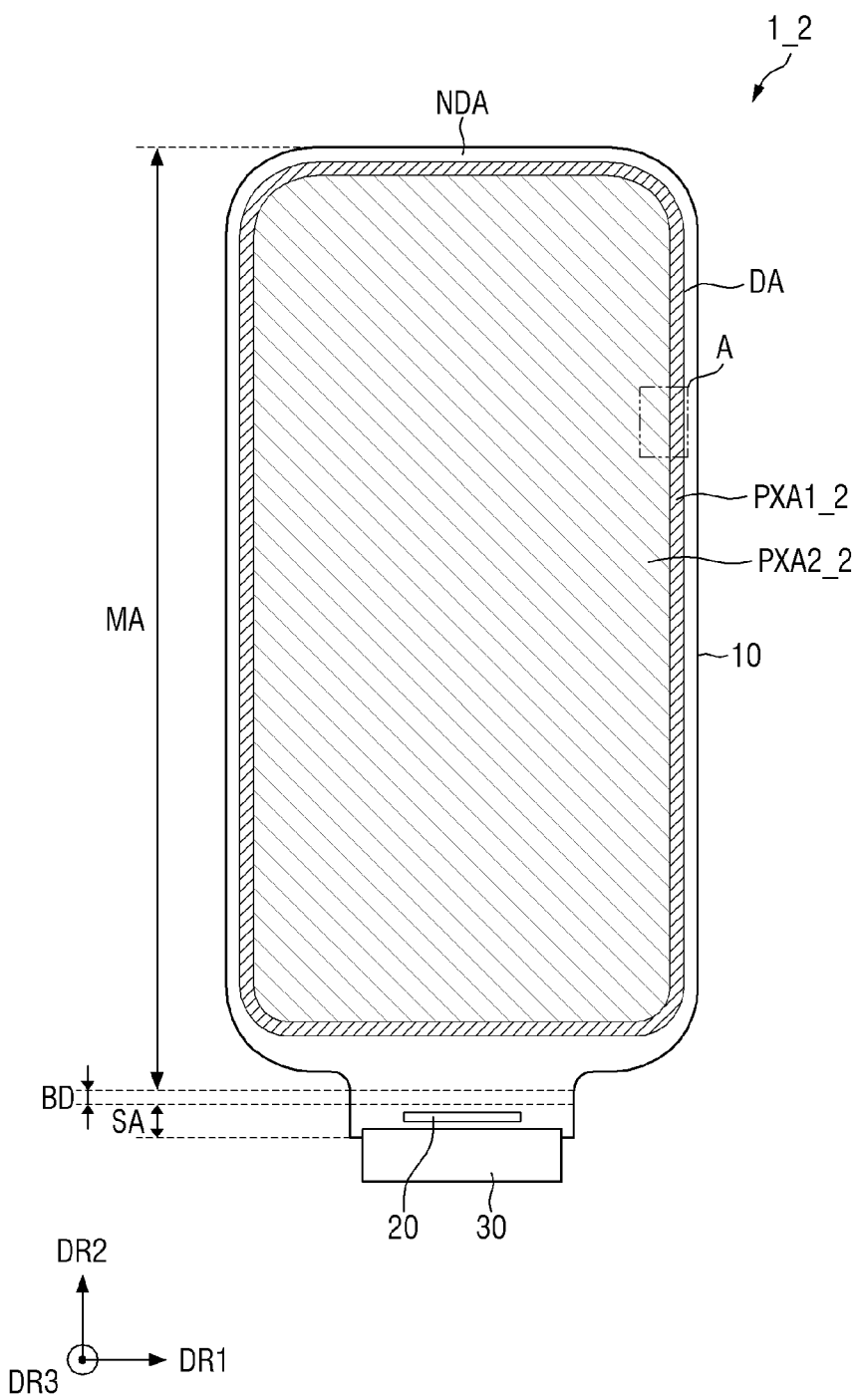
FIG. 12 is a plan view of an embodiment of a display device.
Figure 13:
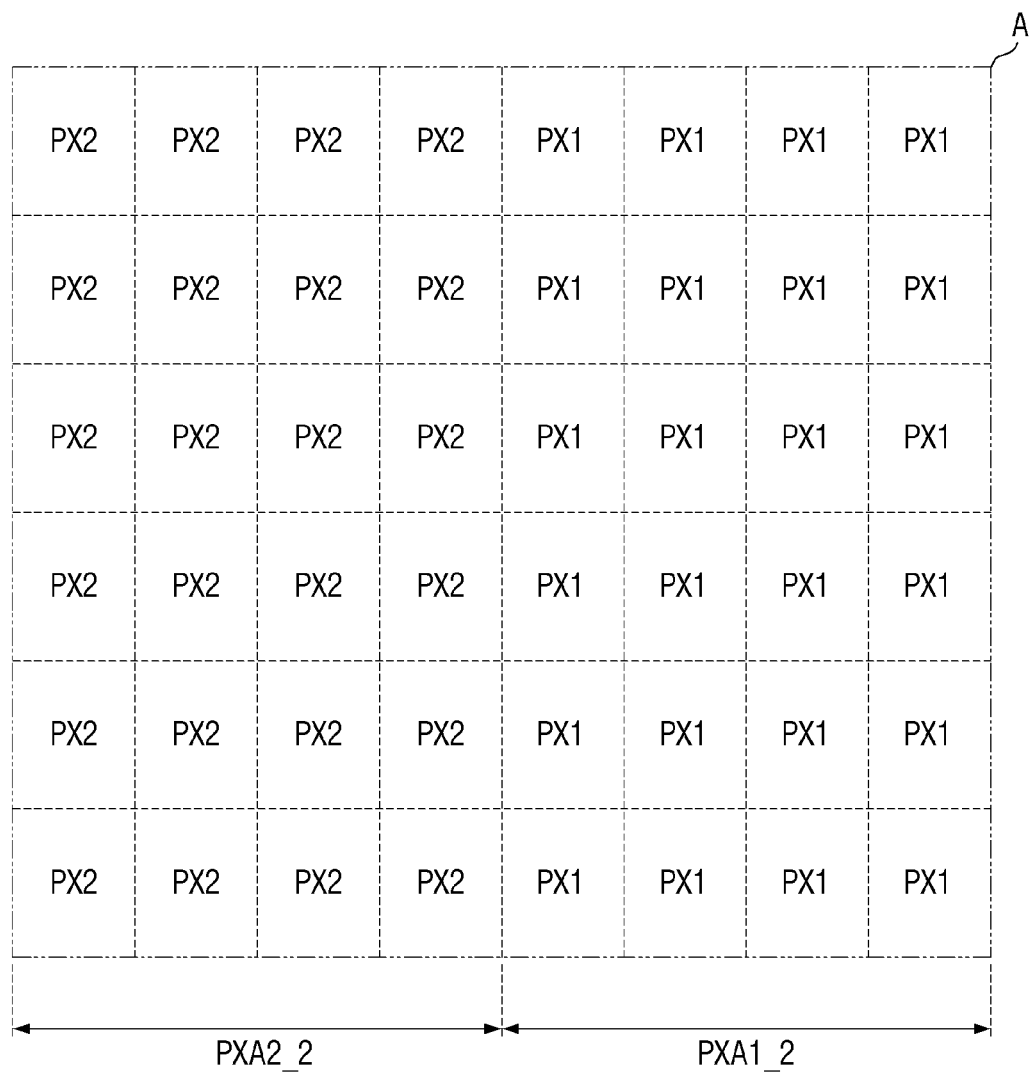
FIG. 13 is an enlarged view of area A of FIG. 12.
Figure 14:
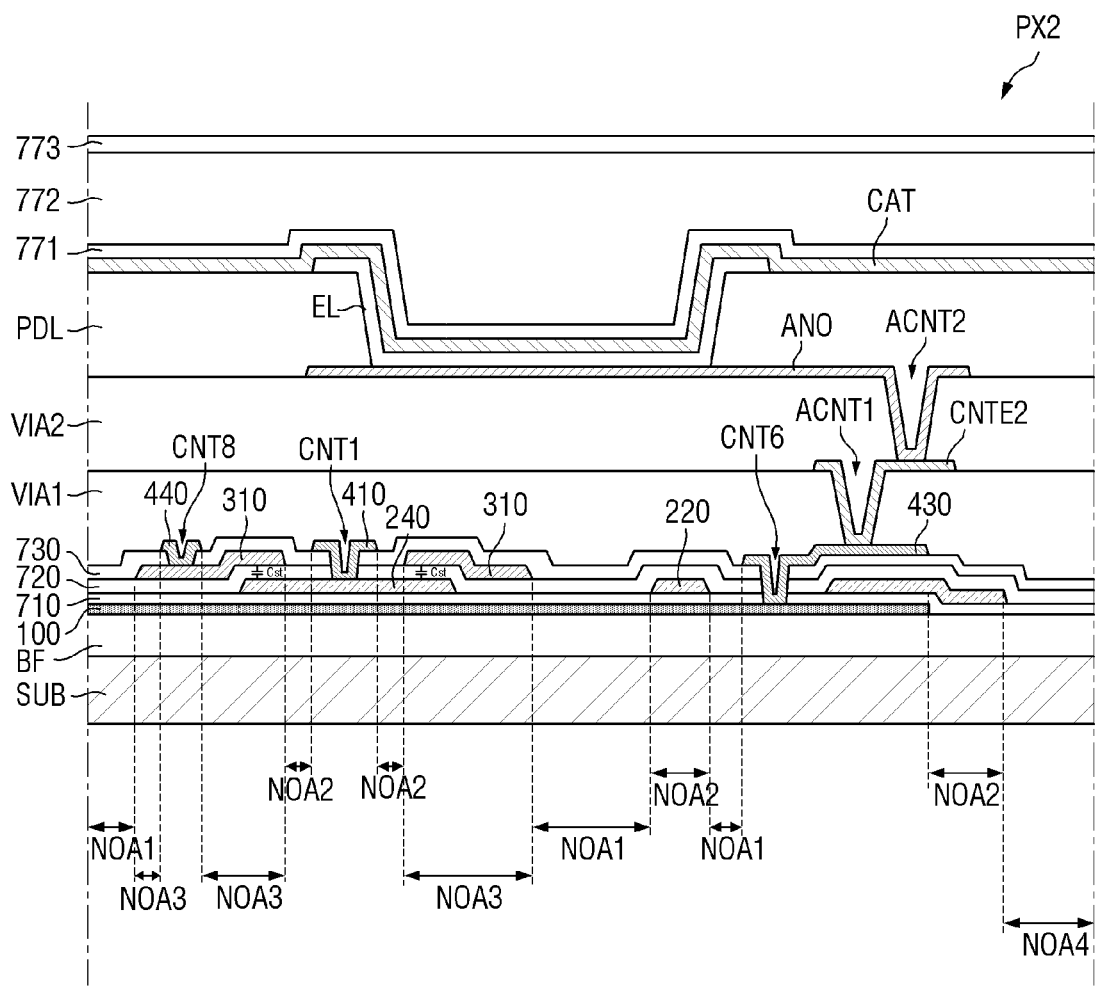
FIG. 14 is an exemplary cross-sectional view of an embodiment of a second pixel.

FIG. 12 is a plan view of an embodiment of a display device 1_2. FIG. 13 is an enlarged view of area A of FIG. 12. FIG. 14 is an exemplary cross-sectional view of an embodiment of a second pixel PX2. FIG. 12 illustrates the arrangement of a first pixel area PXA1_2 and a second pixel area PXA2_2.

Referring to FIGS. 12 through 14, the display device 1_2 in the illustrated embodiment may include first pixels PX1 and second pixels PX2 having different stacked structures. Each of the first pixels PX1 may include substantially the same stacked structure as the stacked structure of the pixel PX (refer to FIG. 6) in the embodiment of FIG. 6.

Conductive layers 200, 300 and 400 of each of the second pixels PX2 may not be exposed by an inorganic insulating layer. In other words, the conductive layers 200, 300 and 400 (refer to FIG. 4) of each of the second pixels PX2 may be overlapped by at least any one of a first insulating layer 710, a second insulating layer 720, and a third insulating layer 730 in the thickness direction (third direction DR3). The conductive layers 200, 300 and 400 of each of the second pixels PX2 may be covered by at least any one of the first insulating layer 710, the second insulating layer 720, and the third insulating layer 730. That is, the first insulating layer 710, the second insulating layer 720 and the third insulating layer 730 of each of the second pixels PX2 may cover at least any one of the conductive layers 200, 300 and 400.

A first opening OP1 may not be defined in the first insulating layer 710, a second opening OP2 may not be defined in the second insulating layer 720, and a third opening OP3 may not be defined in the third insulating layer 730.

For example, in each of the second pixels PX2, the second insulating layer 720 may cover the entire area of upper and side surfaces of a first conductive layer 200 excluding an area in which a contact hole is defined. That is, in each of the second pixels PX2, at least any one of the second insulating layer 720 and the third insulating layer 730 may be disposed in a second non-overlap area NOA2 in which the first conductive layer 200 does not overlap a second conductive layer 300 and a third conductive layer 400. In addition, in each of the second pixels PX2, the third insulating layer 730 may cover the entire area of upper and side surfaces of the second conductive layer 300 excluding an area in which a contact hole is defined. That is, in each of the second pixels PX2, the third insulating layer 730 may be disposed in a third non-overlap area NOA3 in which the second conductive layer 300 does not overlap the third conductive layer 400.

The display device 1_2 in the illustrated embodiment may further include the first pixel area PXA1_2 and the second pixel area PXA2_2. The first pixels PX1 may be disposed in the first pixel area PXA1_2, and the second pixels PX2 may be disposed in the second pixel area PXA2_2.

The first pixel area PXA1_2 and the second pixel area PXA2_2 may be disposed in a display area DA and may not overlap each other. The first pixel area PXA1_2 may be disposed outside the second pixel area PXA2_2. The first pixel area PXA1_2 may be disposed on at least any one of first and second sides of the second pixel area PXA2_2 in the first direction DR1 and first and second sides of the second pixel area PXA2_2 in the second direction DR2. In an embodiment, the first pixel area PXA1_2 may be disposed on all of the first and second sides of the second pixel area PXA2_2 in the first direction DR1 and the first and second sides of the second pixel area PXA2_2 in the second direction DR2, for example. In other words, the first pixel area PXA1_2 may be disposed along edges of the display area DA and may surround the second pixel area PXA2_2. In this case, the first pixels PX1_2 may be disposed along the edges of the display area DA and may surround the second pixels PX2_2.

The number of first pixels PX1 disposed in a direction perpendicular to a direction in which the first pixel area PXA1_2 extends may be one or more. In an embodiment, in FIG. 13, four first pixels PX1 are disposed along the first direction DR1 in a part in which the first pixel area PXA1_2 extends in the second direction DR2, for example. However, the invention is not limited thereto, and one or more first pixels PX1 may be disposed.

In this case, since parts of the insulating layers 710, 720 and 730 overlapping the conductive layers 200, 300 and 400 are removed, and the removed parts are filled with a first via layer VIA1 in each of the first pixels PX1, the transmission of external impact along an inorganic insulating layer may be suppressed or prevented. In an embodiment, the impact applied to an edge part of the display device 1_2 may not be transmitted into the display device 1_2 by the first pixels PX1, for example. Therefore, defects such as bright spots or dark spots on the display device 1_2 may be suppressed or prevented, and the reliability of the display device 1_2 may be improved.

In addition, since the inorganic insulating layers are not removed in each of the second pixels PX2, structural stability in each of the second pixels PX2 may be improved, and the encapsulation of the conductive layers 200, 300 and 400 may be improved. Therefore, the first pixels PX1 disposed along the edges of the display area DA and the second pixels PX2 disposed inside the display area DA may suppress or prevent the impact applied to the edge part of the display device 1_2 from being transmitted into the display device 1_2 and may improve the structural stability of the display device 1_2 and the encapsulation of the conductive layers 200, 300 and 400.

Figure 15:
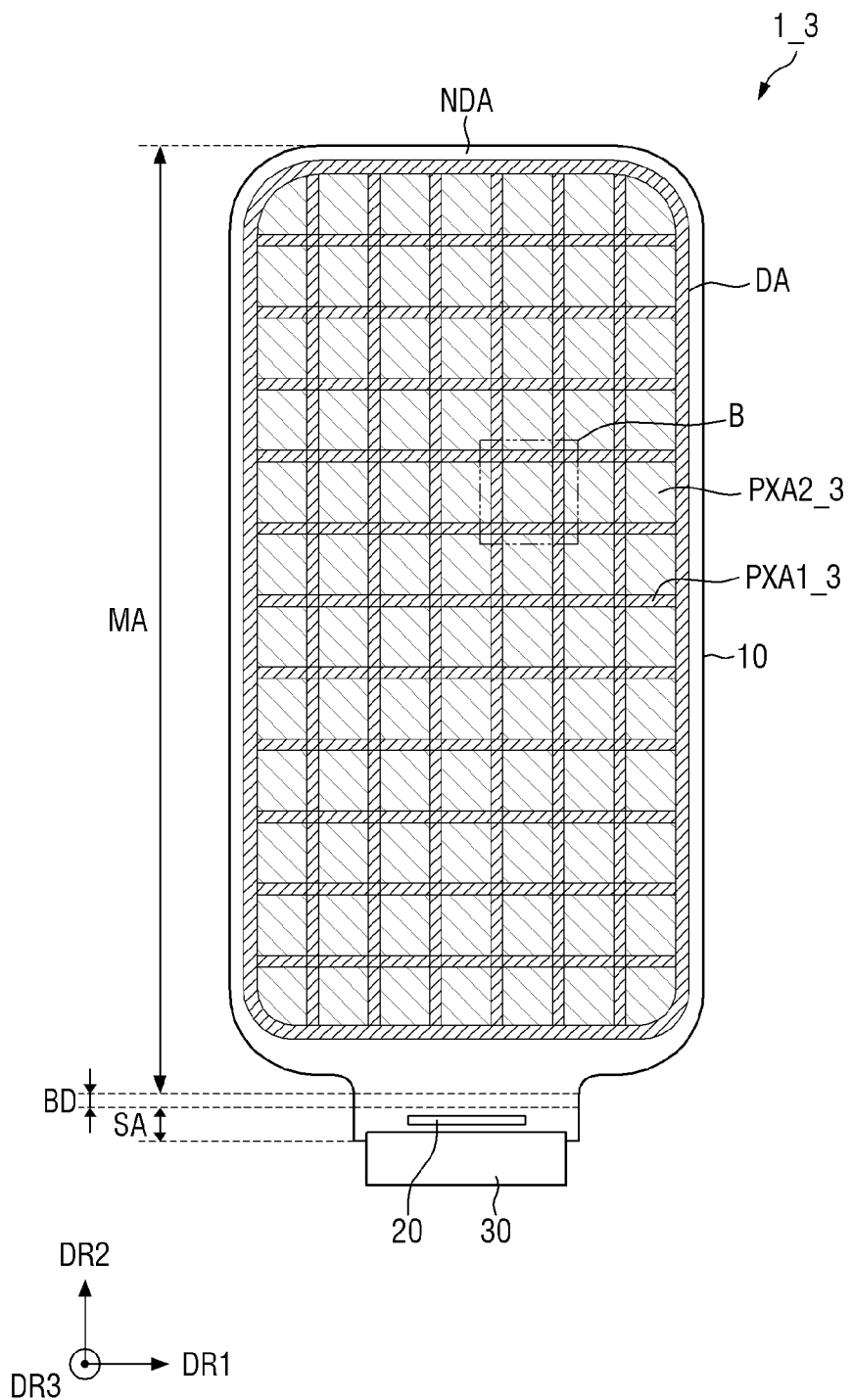
FIG. 15 is a plan view of an embodiment of a display device.
Figure 16:
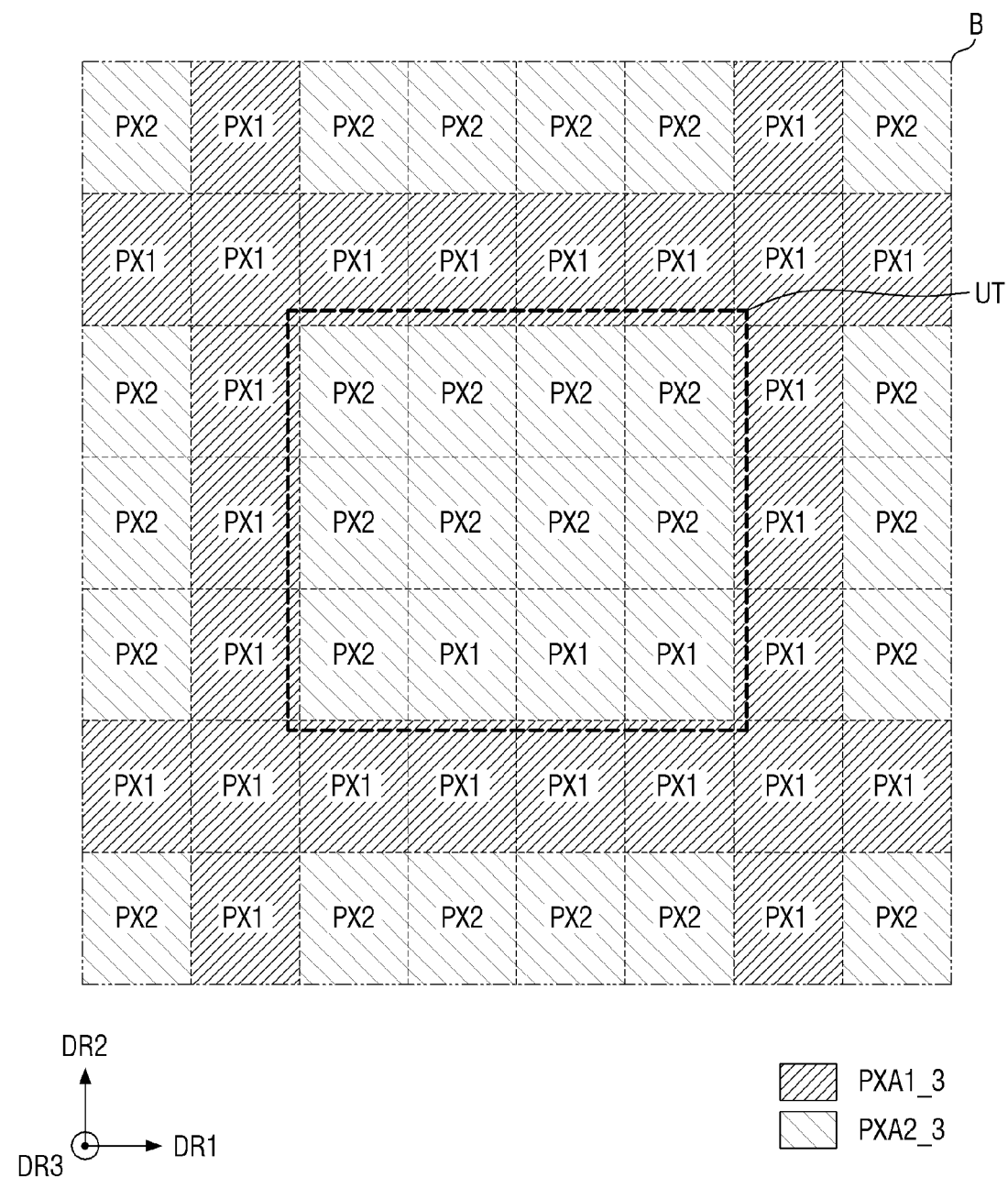
FIG. 16 is an enlarged view of area B of FIG. 15.

FIG. 15 is a plan view of an embodiment of a display device 1_3. FIG. 16 is an enlarged view of area B of FIG. 15.

Referring to FIGS. 15 and 16, the display device 1_3 in the illustrated embodiment is different from the embodiment of FIGS. 12 through 14 in that first pixels PX1 and second pixels PX2 may be arranged in various ways.

Specifically, a second pixel area PXA2_3 of the display device 1_3 in the illustrated embodiment may be separated by a first pixel area PXA1_3. That is, the first pixel area PXA1_3 may include a lattice shape across the second pixel area PXA2_3, and the second pixel area PXA2_3 may be disposed in the lattice shape of the first pixel area PXA1_3.

The second pixel area PXA2_3 may further include a plurality of repeating arrangement units UT separated from each other and repeatedly disposed along the first direction DR1 and the second direction DR2. The repeating arrangement units UT may be spaced apart from each other with the first pixel area PXA1_3 interposed between them. Each repeating arrangement unit UT may be surrounded by the first pixel area PXA1_3.

Each repeating arrangement unit UT may include at least one second pixel PX2. In an embodiment, in FIG. 16, three second pixels PX2 are disposed along the second direction DR2, and four second pixels PX2 are disposed along the first direction DR1 in each repeating arrangement unit UT, for example. However, the invention is not limited thereto. In addition, each repeating arrangement unit UT may include a quadrangular (e.g., rectangular) shape in a plan view. However, the invention is not limited thereto, and each repeating arrangement unit UT may also have various shapes in a plan view, and the second pixels PX2 may also be arranged in various ways in each repeating arrangement unit UT.

In addition, in the first pixel area PXA1_3 disposed between the repeating arrangement units UT, the number of first pixels PX1 disposed in a direction perpendicular to a direction in which the first pixel area PXA1_3 extends may be one or more. In an embodiment, in FIG. 16, the number of first pixels PX1 disposed in the first pixel area PXA1_3 which is disposed between the repeating arrangement units UT and extends in the first direction DR1 is one according to the second direction DR2, for example, but the invention is not limited thereto.

In this case, since parts of insulating layers 710, 720 and 730 overlapping conductive layers 200, 300 and 400 are removed, and the removed parts are filled with a first via layer VIA1 in each of the first pixels PX1, the transmission of external impact along an inorganic insulating layer may be suppressed or prevented. In addition, since the inorganic insulating layers are not removed in each of the second pixels PX2, structural stability in each of the second pixels PX2 may be improved, and the encapsulation of the conductive layers 200, 300 and 400 may be improved.

Furthermore, since the second pixel area PXA2_3 includes a plurality of repeating arrangement units UT, and each repeating arrangement unit UT is surrounded by the first pixel area PXA1_3, the transmission of not only the impact applied to an edge part of the display device 1_3 but also the external impact applied to a display area DA may be suppressed or prevented. Therefore, the reliability of the display device 1_3 may be further improved.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
   a plurality of first pixels;
   a substrate;
   a first semiconductor layer which is disposed on the substrate and comprises an active layer of a first transistor;
   a first insulating layer which is disposed on the first semiconductor layer;
   a first conductive layer which is disposed on the first insulating layer and comprises a gate electrode of the first transistor;
   a second insulating layer which is disposed on the first conductive layer; and
   a second conductive layer which is disposed on the second insulating layer and comprises a first electrode and a second electrode of the first transistor,
   wherein a first opening exposing the first conductive layer in an area in which i) the first conductive layer and the second conductive layer of each of the plurality of first pixels do not overlap and ii) the first conductive layer overlaps the semiconductor layer is defined in the second insulating layer.

2. The display device of claim 1, further comprising:
   a second semiconductor layer which is disposed on the second insulating layer and comprises an active layer of a second transistor;
   a third insulating layer which is disposed on the second semiconductor layer;
   a third conductive layer which is disposed on the third insulating layer and comprises a gate electrode of the second transistor; and
   a fourth insulating layer which is disposed on the third conductive layer,
   wherein the second semiconductor layer, the third insulating layer, the third conductive layer and the fourth insulating layer are disposed between the second insulating layer and the second conductive layer.

3. The display device of claim 2, wherein the fourth insulating layer defines a second opening in an area in which the second conductive layer and the third conductive layer of each of the plurality of first pixels do not overlap.

4. The display device of claim 3, wherein the first opening overlaps the second opening.

5. The display device of claim 4, wherein the first semiconductor layer comprises polycrystalline silicon, and the second semiconductor layer comprises an oxide semiconductor.

6. The display device of claim 1, wherein at least any one of the first insulating layer and the second insulating layer is disposed on the first semiconductor layer in an area not overlapping the first conductive layer and the second conductive layer.

7. The display device of claim 6, wherein a thickness of the second insulating layer disposed on the first semiconductor layer in the area not overlapping the first conductive layer and the second conductive layer is smaller than a thickness of the second insulating layer overlapping the second conductive layer along a thickness direction perpendicular to a main plane extension direction of the substrate.

8. The display device of claim 6, wherein an entirety of the first semiconductor layer overlaps at least any one of the first insulating layer, the second insulating layer, and the second conductive layer.

9. The display device of claim 1, further comprising a buffer layer which is disposed between the substrate and the first semiconductor layer, wherein
   a second opening exposing the buffer layer in an area not overlapping the first semiconductor layer, the first conductive layer and the second conductive layer of each of the plurality of first pixels is defined in the first insulating layer.

10. The display device of claim 1, further comprising a planarization layer which is disposed on the second conductive layer, wherein the first opening of the second insulating layer is filled with the planarization layer.

11. A display device comprising:
    a plurality of first pixels;
    a substrate;
    a first semiconductor layer which is disposed on the substrate and comprises an active layer of a first transistor;
    a first insulating layer which is disposed on the first semiconductor layer;
    a first conductive layer which is disposed on the first insulating layer and comprises a gate electrode of the first transistor;
    a second insulating layer which is disposed on the first conductive layer;
    a second conductive layer which is disposed on the second insulating layer and comprises a first electrode and a second electrode of the first transistor; and
    a planarization layer which is disposed on the second conductive layer,
    wherein a first opening exposing the first conductive layer in an area in which the first conductive layer and the second conductive layer of each of the plurality of first pixels do not overlap is defined in the second insulating layer,
    wherein the first opening of the second insulating layer is filled with the planarization layer, and
    wherein the planarization layer directly contacts the first conductive layer.

12. The display device of claim 1, further comprising a plurality of second pixels, wherein the second insulating layer covers the whole of the first conductive layer in an area in which the first conductive layer and the second conductive layer of each of the plurality of second pixels do not overlap.

13. The display device of claim 12, wherein the plurality of second pixels is disposed in an area surrounded by the plurality of first pixels in a plan view.

14. The display device of claim 13, further comprising a plurality of repeating arrangement units, wherein the plurality of repeating arrangement units each comprises at least one second pixel of the plurality of second pixels and are separated and spaced apart from each other by the plurality of first pixels.

15. The display device of claim 14, wherein the plurality of repeating arrangement units is repeatedly disposed along a first direction and a second direction perpendicular to the first direction in the plan view.

16. The display device of claim 13, further comprising a display area and a non-display area which is disposed outside the display area, wherein the plurality of first pixels is disposed along edges of the display area.

17. The display device of claim 1, wherein a portion of the first conductive layer exposed by the first opening is coplanar with the gate electrode of the first transistor.

18. The display device of claim 1, wherein an entire upper surface of a structure is exposed by the first opening.

19. A method of manufacturing a display device having a plurality of first pixels, the method comprising:
preparing a substrate;
disposing a semiconductor layer comprising an active layer of a first transistor on the substrate;
forming a first insulating layer on the semiconductor layer;
forming a first conductive layer comprising a gate electrode of the first transistor on the first insulating layer;
forming a second insulating layer on the first conductive layer;
forming a second conductive layer comprising a first electrode and a second electrode of the first transistor on the second insulating layer;
forming a photoresist pattern in an area which overlaps the semiconductor layer and does not overlap the first conductive layer and the second conductive layer; and
forming a first opening in the second insulating layer exposing the first conductive layer in an area in which i) the first conductive layer and the second conductive layer do not overlap and ii) the first conductive layer and the semiconductor layer overlap by etching the second insulating layer using the photoresist pattern as an etch mask.

20. The method of claim 19, wherein the etching the second insulating layer is performed by drying etching.

21. The method of claim 19, wherein a portion of the first conductive layer exposed by the first opening is coplanar with the gate electrode of the first transistor.

22. The method of claim 19, wherein an entire upper surface of a structure is exposed by the first opening.

* * * * *